United States Patent

Crouse et al.

(10) Patent No.: US 10,550,690 B2
(45) Date of Patent: Feb. 4, 2020

(54) MASS EXCHANGE MODEL FOR RELATIVE PERMEABILITY SIMULATION

(71) Applicant: Dassault Systemes Simulia Corp., Johnston, RI (US)

(72) Inventors: Bernd Crouse, Burlington, MA (US); Xiaobo Nie, Burlington, MA (US); Raoyang Zhang, Burlington, MA (US); Yong Li, Burlington, MA (US); Hiroshi Otomo, Burlington, MA (US); Hudong Chen, Newton, MA (US); Andrew Fager, San Francisco, CA (US); David M. Feed, Brisbane, CA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 611 days.

(21) Appl. No.: 14/277,909

(22) Filed: May 15, 2014

(65) Prior Publication Data

US 2014/0343858 A1 Nov. 20, 2014

Related U.S. Application Data

(60) Provisional application No. 61/824,100, filed on May 16, 2013.

(51) Int. Cl.
*E21B 49/00* (2006.01)
*G01V 99/00* (2009.01)
*G06F 17/50* (2006.01)

(52) U.S. Cl.
CPC ............ *E21B 49/00* (2013.01); *G01V 99/005* (2013.01); *G06F 17/5009* (2013.01)

(58) Field of Classification Search
None
See application file for complete search history.

(56) References Cited

U.S. PATENT DOCUMENTS

| | | | |
|---|---|---|---|
| 6,516,080 B1 * | 2/2003 | Nur | G06T 7/40 348/85 |
| 2006/0277012 A1 | 12/2006 | Ricard et al. | |
| 2008/0126045 A1 * | 5/2008 | Shan | G06F 17/5018 703/9 |
| 2009/0070085 A1 | 3/2009 | Gullapalli et al. | |
| 2010/0128932 A1 | 5/2010 | Dvorkin et al. | |
| 2010/0312535 A1 | 12/2010 | Chen et al. | |
| 2011/0184711 A1 | 7/2011 | Altman et al. | |
| 2011/0313744 A1 | 12/2011 | Oury et al. | |

(Continued)

FOREIGN PATENT DOCUMENTS

| | | |
|---|---|---|
| CN | 102383783 | 6/2015 |
| WO | WO 2012/071090 | 5/2012 |

OTHER PUBLICATIONS

International Search Report and Written Opinion, PCT/US2014/038143, dated Sep. 10, 2014, 13 pages.

(Continued)

*Primary Examiner* — John C Kuan
(74) *Attorney, Agent, or Firm* — Fish & Richardson P.C.

(57) ABSTRACT

This description relates to computer simulation of physical processes, such as computer simulation of multi-species flow through porous media including the determination/estimation of relative permeabilities for the multi-species flow through the porous media.

33 Claims, 11 Drawing Sheets

(56) References Cited

U.S. PATENT DOCUMENTS

2012/0179436 A1    7/2012  Fung
2013/0018641 A1*   1/2013  Prisco ................ G06F 17/5009
                                                          703/9
2013/0116997 A1    5/2013  Sun et al.

OTHER PUBLICATIONS

Huang et al.; Shan-and-Chen Type Multiphase Lattice Boltzmann Study of Viscous Coupling Effects for Two-Phase Flow in Porour Media; International Journal for Numerical Methods in Fluids; vol. 61, No. 3; Sep. 30, 2009; 14 pages.
Supplemental European Search Report and Written Opinion; EP 14 79 7363; dated Apr. 18, 2017; 11 pages.
Notification of Reasons for Rejection with English Translation; JP Appln. No. 2016-514084; dated Jun. 21, 2018; 6 pages.

* cited by examiner

MASS EXCHANGE MODEL FOR RELATIVE PERMEABILITY SIMULATION

CLAIM OF PRIORITY

This application claims priority under 35 USC § 119(e) to U.S. Provisional Patent Application Ser. No. 61/824,100, filed on May 16, 2013 and entitled "Mass Sink/source Model for Capturing History Effects in Relative Permeability Simulations," the entire contents of which are hereby incorporated by reference.

TECHNICAL FIELD

This description relates to computer simulation of physical processes, such as computer simulation of multi-species flow through porous media including the determination/estimation of relative permeabilities for the multi-species flow through the porous media.

BACKGROUND

Hydrocarbons found underground are typically present in rock formations. These rock formations are usually porous to some respect and can be classified as porous media. Hydrocarbon extraction from this porous media is often performed using a fluid (e.g., water) immiscible with the hydrocarbon. To understand hydrocarbon extraction from a porous media, simulations are used to characterize the porous media and the flow through the porous media.

SUMMARY

In general, this document describes techniques for simulating multi-species flow through porous media where the simulation is performed at different saturations. The simulations described herein use a mass sink/source method in which fluid mass is exchanged between the different species at a selected subset of locations (e.g., voxels). In this manner the saturation can be changed while much of the spatial distribution of the fluid species from the previous saturation condition remains unchanged; hence information from the simulation results at one saturation condition influences the simulation at another saturation condition.

In one general aspect, a computer-implemented method for simulating a multi-species flow through porous media includes simulating activity of a multi-phase fluid that includes a first species and a second species in a volume, the activity of the fluid in the volume being simulated so as to model movement of elements within the volume, determining a relative permeability of the first species in the volume for a first saturation value, and removing, from identified exchange regions, a first mass of the first species and replacing the first mass of the first species with a second mass of the second species to modify a saturation value for the volume. The method also includes simulating activity of the multi-phase fluid based on the modified saturation value and determining a relative permeability of the first species in the volume based on the modified saturation value.

Embodiments can include one or more of the following.

The method can also include identifying the exchange regions in the volume, based on a value indicative of movement of the first species within the volume.

Identifying the exchange regions can include identifying a set of convective voxels.

Identifying the convective voxels in the volume can include identifying voxels having a high flow rate of the first species.

Identifying the convective voxels in the volume comprises identifying voxels in which a velocity exceeds a threshold.

Identifying the convective voxels in the volume can include ranking voxels based on their associated velocity and selecting a portion of the voxels having the greatest velocity.

Removing the first mass of the first species and replacing the first mass of the first species with the second mass of the second species can include replacing the first mass of the first species with an equal mass of the second species.

Removing, from the identified exchange regions, the first mass of the first species and replacing the first mass of the first species with the equal mass of the second species can include performing a mass exchange process over multiple time steps until a desired saturation value is obtained.

Simulating the activity of the multi-phase fluid can include simulating the activity of the multi-phase fluid until the effective permeabilities converge.

The first species can be oil and the second species can be water.

The volume can be a porous media volume.

Simulating the activity of the multi-phase fluid can include simulating the activity of the multi-phase fluid in a periodic domain using a gravity driven simulation.

Simulating activity of the fluid in the volume can include performing interaction operations on the state vectors, the interaction operations modeling interactions between elements of different momentum states according to a model and performing first move operations of the set of state vectors to reflect movement of elements to new voxels in the volume according to the model.

Implementations of the techniques discussed above may include a method or process, a system or apparatus, or computer software on a computer-accessible medium.

In some additional aspects, a method for estimating the productivity of a hydrocarbon reservoir includes simulating activity of a multi-phase fluid that includes at least oil and water in a hydrocarbon reservoir, the activity of the fluid in the hydrocarbon reservoir being simulated so as to model movement of elements within the hydrocarbon reservoir, determining a relative permeability of oil and a relative permeability of water in the hydrocarbon reservoir for a first saturation value, removing, from identified exchange regions, a first mass of the oil and replacing the first mass of the oil with a second mass of water to modify a saturation value for the volume, simulating activity of the multi-phase fluid based on the modified saturation value, determining a relative permeability of oil and a relative permeability of water in the hydrocarbon reservoir based on the modified saturation value, and estimating of the amount of oil which can be produced from the hydrocarbon reservoir based on the determined relative permeabilities.

Implementations of the techniques discussed above may include a method or process, a system or apparatus, or computer software on a computer-accessible medium.

The systems and method and techniques may be implemented using various types of numerical simulation approaches such as the Shan-Chen method for multi-phase flow and the Lattice Boltzmann formulation. Further information about the Lattice Boltzmann formulation will be described herein. However, the systems and techniques described herein are not limited to simulations using the Lattice Boltzmann formulation and can be applied to other numerical simulation approaches.

The systems and techniques may be implemented using a lattice gas simulation that employs a Lattice Boltzmann formulation The traditional lattice gas simulation assumes a limited number of particles at each lattice site, with the particles being represented by a short vector of bits. Each bit represents a particle moving in a particular direction. For example, one bit in the vector might represent the presence (when set to 1) or absence (when set to 0) of a particle moving along a particular direction. Such a vector might have six bits, with, for example, the values 110000 indicating two particles moving in opposite directions along the X axis, and no particles moving along the Y and Z axes. A set of collision rules governs the behavior of collisions between particles at each site (e.g., a 110000 vector might become a 001100 vector, indicating that a collision between the two particles moving along the X axis produced two particles moving away along the Y axis). The rules are implemented by supplying the state vector to a lookup table, which performs a permutation on the bits (e.g., transforming the 110000 to 001100). Particles are then moved to adjoining sites (e.g., the two particles moving along the Y axis would be moved to neighboring sites to the left and right along the Y axis).

In an enhanced system, the state vector at each lattice site includes many more bits (e.g., 54 bits for subsonic flow) to provide variation in particle energy and movement direction, and collision rules involving subsets of the full state vector are employed. In a further enhanced system, more than a single particle is permitted to exist in each momentum state at each lattice site, or voxel (these two terms are used interchangeably throughout this document). For example, in an eight-bit implementation, 0-255 particles could be moving in a particular direction at a particular voxel. The state vector, instead of being a set of bits, is a set of integers (e.g., a set of eight-bit bytes providing integers in the range of 0 to 255), each of which represents the number of particles in a given state.

In a further enhancement, Lattice Boltzmann Methods (LBM) use a mesoscopic representation of a fluid to simulate 3D unsteady compressible turbulent flow processes in complex geometries at a deeper level than possible with conventional computational fluid dynamics ("CFD") approaches. A brief overview of LBM method is provided below.

Boltzmann-Level Mesoscopic Representation

It is well known in statistical physics that fluid systems can be represented by kinetic equations on the so-called "mesoscopic" level. On this level, the detailed motion of individual particles need not be determined. Instead, properties of a fluid are represented by the particle distribution functions defined using a single particle phase space, $f=f(x,v,t)$, where x is the spatial coordinate while v is the particle velocity coordinate. The typical hydrodynamic quantities, such as mass, density, fluid velocity and temperature, are simple moments of the particle distribution function. The dynamics of the particle distribution functions obeys a Boltzmann equation:

$$\partial_t f + v \nabla_x f + F(x,t) \nabla_v f = C\{f\}, \quad \text{Eq. (1)}$$

where F(x,t) represents an external or self-consistently generated body-force at (x,t). The collision term C represents interactions of particles of various velocities and locations. It is important to stress that, without specifying a particular form for the collision term C, the above Boltzmann equation is applicable to all fluid systems, and not just to the well-known situation of rarefied gases (as originally constructed by Boltzmann).

Generally speaking, C includes a complicated multi-dimensional integral of two-point correlation functions. For the purpose of forming a closed system with distribution functions $f$ alone as well as for efficient computational purposes, one of the most convenient and physically consistent forms is the well-known BGK operator. The BGK operator is constructed according to the physical argument that, no matter what the details of the collisions, the distribution function approaches a well-defined local equilibrium given by $\{f^{eq}(x,v,t)\}$ via collisions:

$$C = -\frac{1}{\tau}(f - f^{eq}), \quad \text{Eq. (2)}$$

where the parameter τ represents a characteristic relaxation time to equilibrium via collisions. Dealing with particles (e.g., atoms or molecules) the relaxation time is typically taken as a constant. In a "hybrid" (hydro-kinetic) representation, this relaxation time is a function of hydrodynamic variables like rate of strain, turbulent kinetic energy and others. Thus, a turbulent flow may be represented as a gas of turbulence particles ("eddies") with the locally determined characteristic properties.

Numerical solution of the Boltzmann-BGK equation has several computational advantages over the solution of the Navier-Stokes equations. First, it may be immediately recognized that there are no complicated nonlinear terms or higher order spatial derivatives in the equation, and thus there is little issue concerning advection instability. At this level of description, the equation is local since there is no need to deal with pressure, which offers considerable advantages for algorithm parallelization. Another desirable feature of the linear advection operator, together with the fact that there is no diffusive operator with second order spatial derivatives, is its ease in realizing physical boundary conditions such as no-slip surface or slip-surface in a way that mimics how particles truly interact with solid surfaces in reality, rather than mathematical conditions for fluid partial differential equations ("PDEs"). One of the direct benefits is that there is no problem handling the movement of the interface on a solid surface, which helps to enable lattice-Boltzmann based simulation software to successfully simulate complex turbulent aerodynamics. In addition, certain physical properties from the boundary, such as finite roughness surfaces, can also be incorporated in the force. Furthermore, the BGK collision operator is purely local, while the calculation of the self-consistent body-force can be accomplished via near-neighbor information only. Consequently, computation of the Boltzmann-BGK equation can be effectively adapted for parallel processing.

Lattice Boltzmann Formulation

Solving the continuum Boltzmann equation represents a significant challenge in that it entails numerical evaluation of an integral-differential equation in position and velocity phase space. A great simplification took place when it was observed that not only the positions but the velocity phase space could be discretized, which resulted in an efficient numerical algorithm for solution of the Boltzmann equation. The hydrodynamic quantities can be written in terms of simple sums that at most depend on nearest neighbor information. Even though historically the formulation of the lattice Boltzmann equation was based on lattice gas models prescribing an evolution of particles on a discrete set of velocities $v(\in\{c_i, i=1, \ldots, b\})$, this equation can be systematically derived from the first principles as a discretization of the continuum Boltzmann equation. As a result, LBE does not suffer from the well-known problems associated with the lattice gas approach. Therefore, instead of dealing with the continuum distribution function in phase space, $f(x,v,t)$, it is only necessary to track a finite set of discrete distributions, $f_i(x,t)$ with the subscript labeling the discrete velocity indices. The key advantage of dealing with this kinetic equation instead of a macroscopic description is that the increased phase space of the system is offset by the locality of the problem.

Due to symmetry considerations, the set of velocity values are selected in such a way that they form certain lattice structures when spanned in the configuration space. The dynamics of such discrete systems obeys the LBE having the form $f_i(x+c_i, t+1)-f_i(x,t)=C_i(x,t)$, where the collision operator usually takes the BGK form as described above. By proper choices of the equilibrium distribution forms, it can be theoretically shown that the lattice Boltzmann equation gives rise to correct hydrodynamics and thermo-hydrodynamics. That is, the hydrodynamic moments derived from $f_i(x,t)$ obey the Navier-Stokes equations in the macroscopic limit. These moments are defined as:

$$\rho(x, t) = \sum_i f_i(x, t);$$
$$\rho u(x, t) = \sum_i c_i f_i(x, t);$$
$$DT(x, t) = \sum_i (c_i - u)^2 f_i(x, t),$$

Eq. (3)

where $\rho$, u, and T are, respectively, the fluid density, velocity and temperature, and D is the dimension of the discretized velocity space (not at all equal to the physical space dimension).

Other features and advantages will be apparent from the following description, including the drawings, and the claims.

DESCRIPTION

A. Approach to Relative Permeability Simulations

Figure 1:
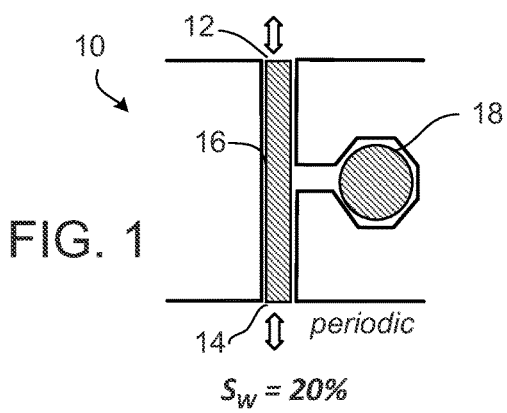
FIG. 1 illustrates a periodic system of a vertical pore which has a dead-end pore attached to it.

When completing complex fluid flow simulations of multi-species flow through porous media it can be beneficial to capture history effects. For example, when simulating hydrocarbon extraction from a rock formation it can be beneficial to include history effects to determine trapped pockets or portion of hydrocarbon which do not move when fluid is injected into the formation.

In this regard, exemplary multi-species flow through porous media can include computer simulation of multi-species porous media flow through real reservoir rock samples. For example, hydrocarbons found underground are typically present in rock formations. These rock formations are usually porous to some respect and can be classified as porous media. Hydrocarbon extraction from this porous media is typically performed using a fluid immiscible with the hydrocarbon such as water. To understand hydrocarbon extraction from the porous media, the systems and methods described herein characterize the porous media and the flow through it. In performing such simulations, the relative permeability of the different species within the system is important. Whereas absolute permeability is a single scalar value and intrinsic to the pore space geometry, relative permeability in multi-species porous media flow analysis is a collection of results showing how easily each species moves as a function of the volume fraction (saturation) of the reference species (often water). The term "relative" is used to indicate that the permeability of a species in the presence of multiple species is normalized by the absolute permeability. A relative permeability plot is achieved when the permeability results for each species over the important range of saturation values are obtained. In such simulations, the porous media sample is captured digitally, typically via a CT or micro-CT scanning process. Analysis and processing of the resulting images can be used to generate a three-dimensional digital representation of the porous rock geometry for use in a numerical flow simulation. A numerical method capable of handling multi-species flow can then be used to simulate the flow through the sample for various saturation conditions to obtain predictions of flow behavior including relative permeability values. In the "steady-state" approach, for each saturation level, the simulation will be run until the effective permeabilities converge. After convergence, the mass source sink model will be turned on and the simulation will be run until the desired saturation level is achieved.

The systems and methods described herein provide a prediction of relative permeabilities for multi-species (e.g. at least two immiscible components) flow through porous media. One exemplary numerical approach is the lattice- Boltzmann method (LBM), for which several different techniques exist for how to extend the usual single-fluid algorithm to be capable of simulating multi-species flow. One of these techniques is known as the Shan-Chen interaction force method. In some implementations, a Shan-Chen-based multi-species LBM approach is used to simulate multi-species flow through porous media to predict important aspects of the flow behavior including relative permeabilities.

FIG. 1 shows diagram 10 of a vertical pore 16 which has a dead-end pore attached to it. As shown in FIG. 1, in performing numerical simulation of multi-species flow through digital porous media, one way to set up the simulation is to use a periodic domain in the flow direction (e.g., by including periodic boundary conditions). With this method, there is no inlet or outlet for the fluid to enter and exit, but rather the fluid leaving one end of the domain 12 immediately enters at the other end 14. Thus, any object/species which leaves the simulation cell on one side enters back on the other. More particularly, when an object passes through a voxel at an outlet end of the simulation space (e.g., 12), it reappears at a corresponding voxel at the inlet (e.g., 14) with the same velocity and direction. To move the fluid through the simulation domain a body force is applied in the desired flow direction. This body force is analogous to (and often labeled) gravity. One potential advantage of a periodic setup is that it avoids the "end effects" that occur when fluids move through the interface between a porous medium and a bulk fluid region; these end effects can have an undesirable impact on the predicted permeability from a simulation.

As noted above, when modeling the multi-phase systems described herein, it is important to determine the effects on the relative permeability of each of the species in the system over a range of saturation values because the relative permeabilities differ for different saturation values. For example, it can be desirable to simulate/determine the relative permeabilities for about 0% saturation, about 20% saturation, about 40% saturation, about 60% saturation, and about 80% saturation, but the choice of saturation levels depends on the rock and also the process the user selected, e.g. a priori fixed Sw versus adaptive Sw. The user may select to simulate only a portion of the possible saturation level.

One method to modify the saturation (e.g., modify the ratio of the various species in the system) is to simply add a desired amount of each of the species into an inlet of the system (e.g., a non-periodic system). However, this method does not provide the stability and computational efficiency benefits of a periodic system as the body force pulls the entire domain simultaneously toward its final state. As such, a method for modifying the saturation value while allowing the system to be simulated as a periodic system is believed to be desirable.

Figures 2A, 2B, 2C:
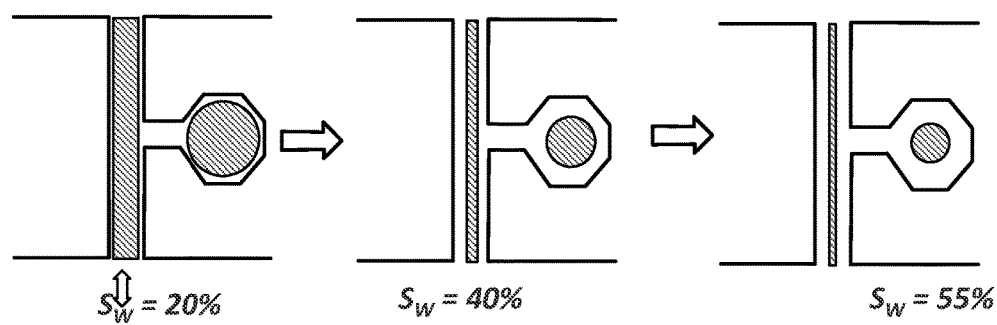
FIGS. 2A-2C illustrate effects in a pore in the exemplary system shown in FIG. 1 without the use of mass exchange hence history effects are not included. The initial fluid distribution is based on a process which distributes the density homogeneously across the entire fluid domain for every single voxel.

Another method to modify the saturation is to perform multiple, separate simulations. Each initialized with the desired saturation value. FIGS. 2A-2C provides an illustration of a set of gravity driven periodic-setup simulations performed at different saturations (e.g., 20% is shown in FIG. 2A, 40% is shown in FIG. 2B, and 55% is shown in FIG. 2C). In the exemplary system shown in the simulations shown in FIG. 2A-2C, the system includes a dead-end pore 18. When fluid flows from the inlet 14 to the outlet 12, the fluid trapped in the dead-end port 18 remains trapped (e.g., non-mobile). In this example, in order to simulate the different saturations, the simulation for each saturation value would be carried out with the same initial condition and independent of the results of the simulations at other saturation values. This means information about where the different fluid species existed in one simulation does not influence any of the other saturation level simulations (covering the desired range of saturation values). As a result, no history/hysteresis effects were captured in the relative permeability predictions. As can be seen in this example, such a simulation which lacks history/hysteresis results in the fluid in the dead-end pore 18 assuming the same saturation value as the fluid in the system overall. However, such a result is not physically obtainable since the fluid within the dead-end pore 18 is trapped.

Figures 3A, 3B, 3C:
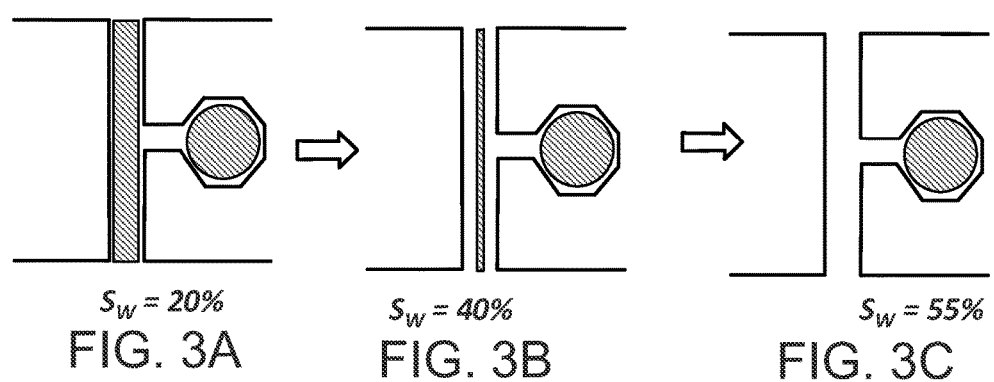
FIGS. 3A-3C illustrate history effects in a pore in the exemplary system shown in FIG. 1 with the use of mass exchange.

The systems and methods described herein provide a periodic system in which simulations at different saturation levels retained historical information from previously simulated saturation levels. FIGS. 3A-3C provide an illustration of a set of gravity driven periodic-setup simulations performed at different saturations performed using the mass exchange methods described herein (e.g., 20% is shown in FIG. 3A, 40% is shown in FIG. 3B, and 55% is shown in FIG. 3C). In the exemplary system shown in the simulations shown in FIG. 3A-3C, the system includes a dead-end pore 18. However, the mass exchange process captures history/hysteresis effects in the relative permeability predictions such that the fluid trapped in the dead-end pore 18 remains trapped (e.g., the species is present in the dead-end pore 18 but motionless) and the relative saturation of the fluid in the dead-end pore 18 does not change. For example, if the system is initialized with 80% oil and 20% water, when the second simulation at 60% oil and 40% water this performed, the percentage of oil within the dead in the pore 18 remains at the initialization percentage of 80% while the percentage of oil in other regions of the system is reduced to a value less than 60%, such that the overall saturation value is 60%. In order to modify the saturation in a physically meaningful manner, the saturation value is modified by replacing a portion of the first species (e.g., oil) with the second species (e.g., water) at physically meaningful locations.

The mass source/sink method exchanges fluid mass between the different species at certain locations. In some examples, this is done while maintaining a constant thermodynamic pressure during the exchange. In some examples, the region where the mass exchange occurs is selected based on the flow rate of the species to be replaced. For example, in the oil and water system, regions where there is a relatively high flow rate ($S=f(\alpha)$) such as the most convective zones within the system or zones with a flow rate exceeding a threshold can be selected as regions for mass exchange to occur. Once the exchange regions have been identified, in the identified exchange regions a portion of the oil is removed from the region and replaced by the water to modify the saturation level.

While oil and water have been described as the first and second species above, the methods described herein can be applied to any set of multiple, different species.

This approach for simulating multi-species porous media flow may be used in conjunction with a time-explicit CFD/CAA solution method based on the Lattice Boltzmann Method (LBM), such as the PowerFLOW system available from Exa Corporation of Burlington, Mass. Unlike methods based on discretizing the macroscopic continuum equations, LBM starts from a "mesoscopic" Boltzmann kinetic equation to predict macroscopic fluid dynamics. The resulting compressible and unsteady solution method may be used for predicting a variety of complex flow physics, such as aeroacoustics and pure acoustics problems. A general discussion of a LBM-based simulation system is provided below and followed by a discussion of a scalar solving approach that may be used in conjunction with fluid flow simulations to support such a modeling approach.

B. Model Simulation Space

In a LBM-based physical process simulation system, fluid flow may be represented by the distribution function values $f_i$, evaluated at a set of discrete velocities $c_i$. The dynamics of the distribution function is governed by Equation 4 where $f_i(0)$ is known as the equilibrium distribution function, defined as:

$$f_\alpha^{(0)} = w_\alpha \rho \left[ 1 + u_\alpha + \frac{u_\alpha^2 - u^2}{2} + \frac{u_\alpha(u_\alpha^2 - 3u^2)}{6} \right] \quad \text{Eq. (4)}$$

where $$u_\alpha = \frac{c_i \hat{u}}{T}.$$

$$f_i(x + e_i, t + 1) - f_i(x, t) = \frac{1}{\tau}\left[f_i(x,t) - f_i^{(eq)}(x,t)\right] \quad \text{Eq. (5)}$$

This equation is the well-known lattice Boltzmann equation that describe the time-evolution of the distribution function, $f_i$. The left-hand side represents the change of the distribution due to the so-called "streaming process." The streaming process is when a pocket of fluid starts out at a grid location, and then moves along one of the velocity vectors to the next grid location. At that point, the "collision operator," i.e., the effect of nearby pockets of fluid on the starting pocket of fluid, is calculated. The fluid can only move to another grid location, so the proper choice of the velocity vectors is necessary so that all the components of all velocities are multiples of a common speed.

The right-hand side of the first equation is the aforementioned "collision operator" which represents the change of the distribution function due to the collisions among the pockets of fluids. The particular form of the collision operator used here is due to Bhatnagar, Gross and Krook (BGK). It forces the distribution function to go to the prescribed values given by the second equation, which is the "equilibrium" form.

From this simulation, conventional fluid variables, such as mass $\rho$ and fluid velocity u, are obtained as simple summations in Equation (3). Here, the collective values of $c_i$ and $w_i$ define a LBM model. The LBM model can be implemented efficiently on scalable computer platforms and run with great robustness for time unsteady flows and complex boundary conditions.

A standard technique of obtaining the macroscopic equation of motion for a fluid system from the Boltzmann equation is the Chapman-Enskog method in which successive approximations of the full Boltzmann equation are taken.

In a fluid system, a small disturbance of the density travels at the speed of sound. In a gas system, the speed of the sound is generally determined by the temperature. The importance of the effect of compressibility in a flow is measured by the ratio of the characteristic velocity and the sound speed, which is known as the Mach number.

Figure 4:
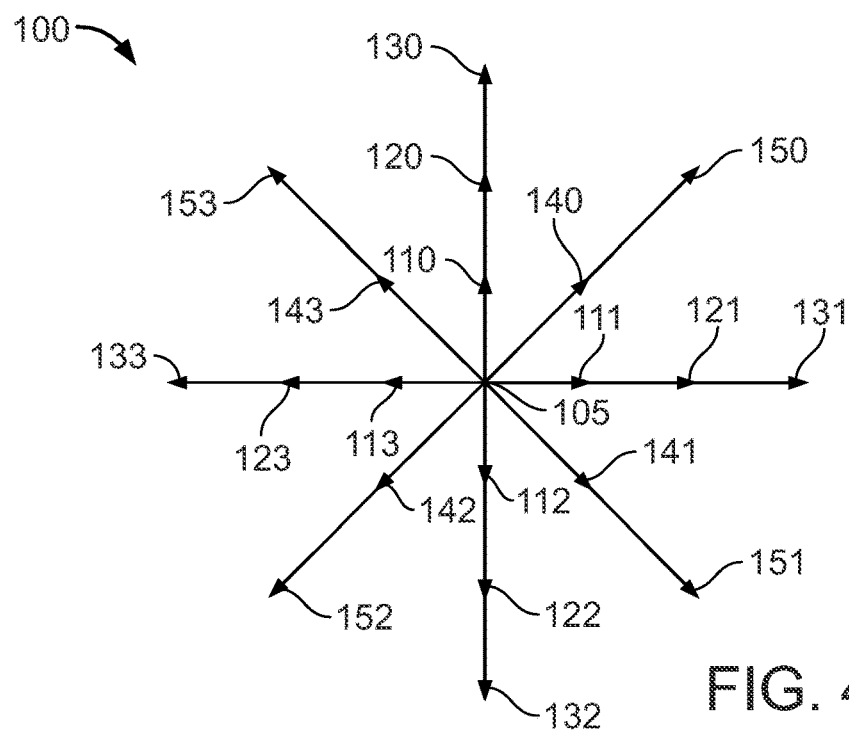
FIGS. 4 and 5 illustrate velocity components of two LBM models.

Referring to FIG. 4, a first model (2D-1) 100 is a two-dimensional model that includes 21 velocities. Of these 21 velocities, one (105) represents particles that are not moving; three sets of four velocities represent particles that are moving at either a normalized speed (r) (110-113), twice the normalized speed (2r) (120-123), or three times the normalized speed (3r) (130-133) in either the positive or negative direction along either the x or y axis of the lattice; and two sets of four velocities represent particles that are moving at the normalized speed (r) (140-143) or twice the normalized speed (2r) (150-153) relative to both of the x and y lattice axes.

Figure 5:
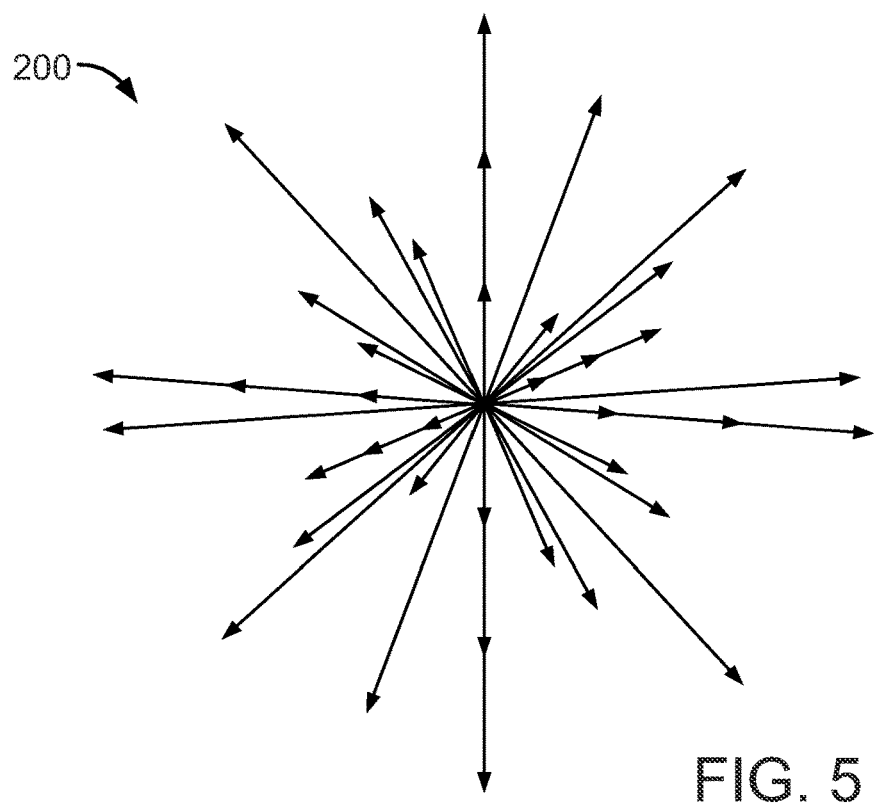

As also illustrated in FIG. 5, a second model (3D-1) 200 is a three-dimensional model that includes 39 velocities, where each velocity is represented by one of the arrowheads of FIG. 5. Of these 39 velocities, one represents particles that are not moving; three sets of six velocities represent particles that are moving at either a normalized speed (r), twice the normalized speed (2r), or three times the normalized speed (3r) in either the positive or negative direction along the x, y or z axis of the lattice; eight represent particles that are moving at the normalized speed (r) relative to all three of the x, y, z lattice axes; and twelve represent particles that are moving at twice the normalized speed (2r) relative to two of the x, y, z lattice axes.

More complex models, such as a 3D-2 model includes 101 velocities and a 2D-2 model includes 37 velocities also may be used.

For the three-dimensional model 3D-2, of the 101 velocities, one represents particles that are not moving (Group 1); three sets of six velocities represent particles that are moving at either a normalized speed (r), twice the normalized speed (2r), or three times the normalized speed (3r) in either the positive or negative direction along the x, y or z axis of the lattice (Groups 2, 4, and 7); three sets of eight represent particles that are moving at the normalized speed (r), twice the normalized speed (2r), or three times the normalized speed (3r) relative to all three of the x, y, z lattice axes (Groups 3, 8, and 10); twelve represent particles that are moving at twice the normalized speed (2r) relative to two of the x, y, z lattice axes (Group 6); twenty four represent particles that are moving at the normalized speed (r) and twice the normalized speed (2r) relative to two of the x, y, z lattice axes, and not moving relative to the remaining axis (Group 5); and twenty four represent particles that are moving at the normalized speed (r) relative to two of the x, y, z lattice axes and three times the normalized speed (3r) relative to the remaining axis (Group 9).

For the two-dimensional model 2D-2, of the 37 velocities, one represents particles that are not moving (Group 1); three sets of four velocities represent particles that are moving at either a normalized speed (r), twice the normalized speed (2r), or three times the normalized speed (3r) in either the positive or negative direction along either the x or y axis of the lattice (Groups 2, 4, and 7); two sets of four velocities represent particles that are moving at the normalized speed (r) or twice the normalized speed (2r) relative to both of the x and y lattice axes; eight velocities represent particles that are moving at the normalized speed (r) relative to one of the x and y lattice axes and twice the normalized speed (2r) relative to the other axis; and eight velocities represent particles that are moving at the normalized speed (r) relative to one of the x and y lattice axes and three times the normalized speed (3r) relative to the other axis.

The LBM models described above provide a specific class of efficient and robust discrete velocity kinetic models for numerical simulations of flows in both two- and three-dimensions. A model of this kind includes a particular set of discrete velocities and weights associated with those velocities. The velocities coincide with grid points of Cartesian coordinates in velocity space which facilitates accurate and efficient implementation of discrete velocity models, particularly the kind known as the lattice Boltzmann models. Using such models, flows can be simulated with high fidelity.

Figure 6:
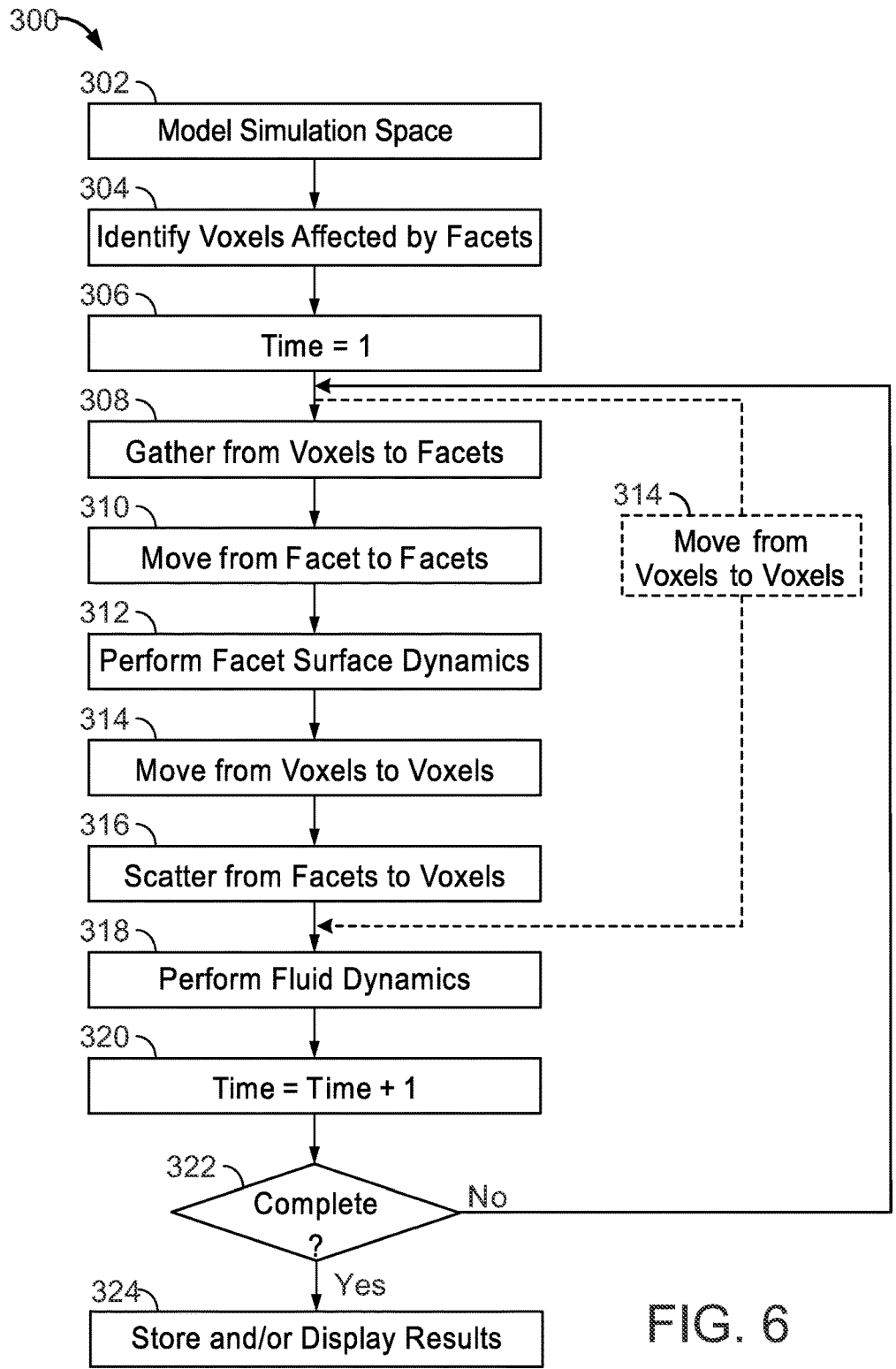
FIG. 6 is a flow chart of a procedure followed by a physical process simulation system.

Referring to FIG. 6, a physical process simulation system operates according to a procedure 300 to simulate a physical process such as fluid flow. Prior to the simulation, a simulation space is modeled as a collection of voxels (step 302). Typically, the simulation space is generated using a computer-aided-design (CAD) program. For example, a CAD program could be used to draw an micro-device positioned in a wind tunnel. Thereafter, data produced by the CAD program is processed to add a lattice structure having appropriate resolution and to account for objects and surfaces within the simulation space.

The resolution of the lattice may be selected based on the Reynolds number of the system being simulated. The Reynolds number is related to the viscosity (v) of the flow, the characteristic length (L) of an object in the flow, and the characteristic velocity (u) of the flow:

$$Re=uL/v.$$ Eq. (6)

The characteristic length of an object represents large scale features of the object. For example, if flow around a micro-device were being simulated, the height of the micro-device might be considered to be the characteristic length. When flow around small regions of an object (e.g., the side mirror of an automobile) is of interest, the resolution of the simulation may be increased, or areas of increased resolution may be employed around the regions of interest. The dimensions of the voxels decrease as the resolution of the lattice increases.

The state space is represented as $f_i(x,t)$, where $f_i$ represents the number of elements, or particles, per unit volume in state i (i.e., the density of particles in state i) at a lattice site denoted by the three-dimensional vector x at a time t. For a known time increment, the number of particles is referred to simply as $f_i(x)$. The combination of all states of a lattice site is denoted as $f(x)$.

The number of states is determined by the number of possible velocity vectors within each energy level. The velocity vectors consist of integer linear speeds in a space having three dimensions: x, y, and z. The number of states is increased for multiple-species simulations.

Each state i represents a different velocity vector at a specific energy level (i.e., energy level zero, one or two). The velocity $c_i$ of each state is indicated with its "speed" in each of the three dimensions as follows:

$$c_i=(c_{i,x},c_{i,y},c_{i,z})$$ Eq. (7)

The energy level zero state represents stopped particles that are not moving in any dimension, i.e. $C_{stopped}=(0, 0, 0)$. Energy level one states represents particles having a ±1 speed in one of the three dimensions and a zero speed in the other two dimensions. Energy level two states represent particles having either a ±1 speed in all three dimensions, or a ±2 speed in one of the three dimensions and a zero speed in the other two dimensions.

Generating all of the possible permutations of the three energy levels gives a total of 39 possible states (one energy zero state, 6 energy one states, 8 energy three states, 6 energy four states, 12 energy eight states and 6 energy nine states.).

Each voxel (i.e., each lattice site) is represented by a state vector f(x). The state vector completely defines the status of the voxel and includes 39 entries. The 39 entries correspond to the one energy zero state, 6 energy one states, 8 energy three states, 6 energy four states, 12 energy eight states and 6 energy nine states. By using this velocity set, the system can produce Maxwell-Boltzmann statistics for an achieved equilibrium state vector.

Figure 7:
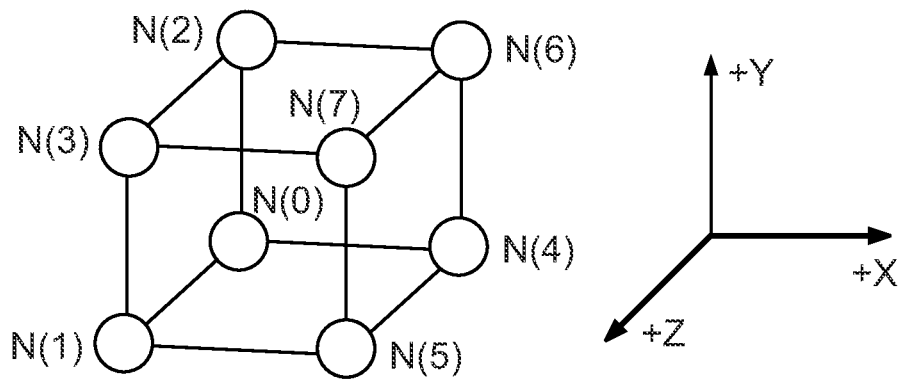
FIG. 7 is a perspective view of a microblock.

For processing efficiency, the voxels are grouped in 2×2×2 volumes called microblocks. The microblocks are organized to permit parallel processing of the voxels and to minimize the overhead associated with the data structure. A short-hand notation for the voxels in the microblock is defined as $N_i(n)$, where n represents the relative position of the lattice site within the microblock and $n \in \{0, 1, 2, \ldots, 7\}$. A microblock is illustrated in FIG. 7.

Figure 8A:
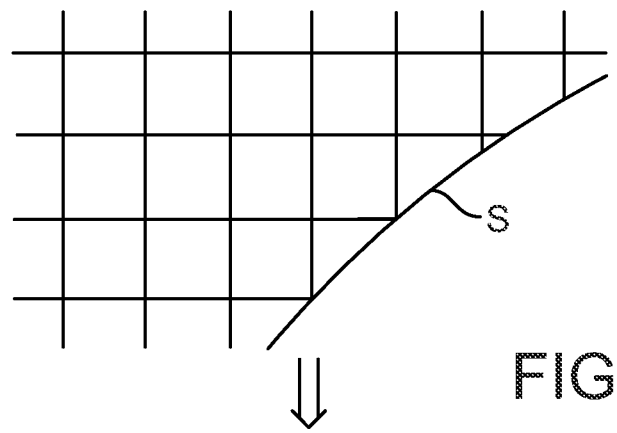
FIGS. 8A and 8B are illustrations of lattice structures used by the system of FIG. 6.
Figure 8B:
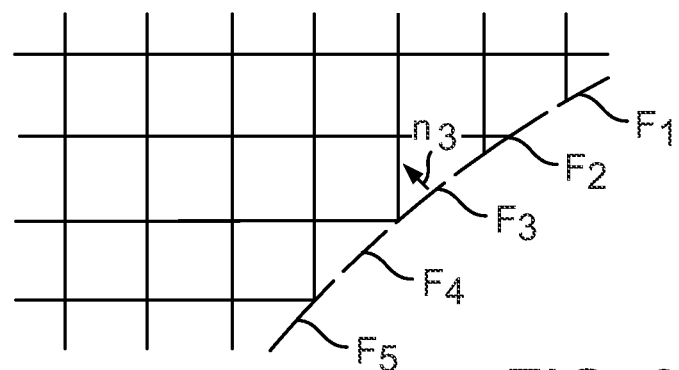

Referring to FIGS. 8A and 8B, a surface S is represented in the simulation space (FIG. 8B) as a collection of facets $F_\alpha$:

$$S=\{F_\alpha\}$$ Eq. (8)

where α is an index that enumerates a particular facet. A facet is not restricted to the voxel boundaries, but is typically sized on the order of or slightly smaller than the size of the voxels adjacent to the facet so that the facet affects a relatively small number of voxels. Properties are assigned to the facets for the purpose of implementing surface dynamics. In particular, each facet $F_\alpha$ has a unit normal ($n_\alpha$), a surface area ($A_\alpha$), a center location ($x_\alpha$), and a facet distribution function ($f_i(\alpha)$) that describes the surface dynamic properties of the facet.

Figure 9:
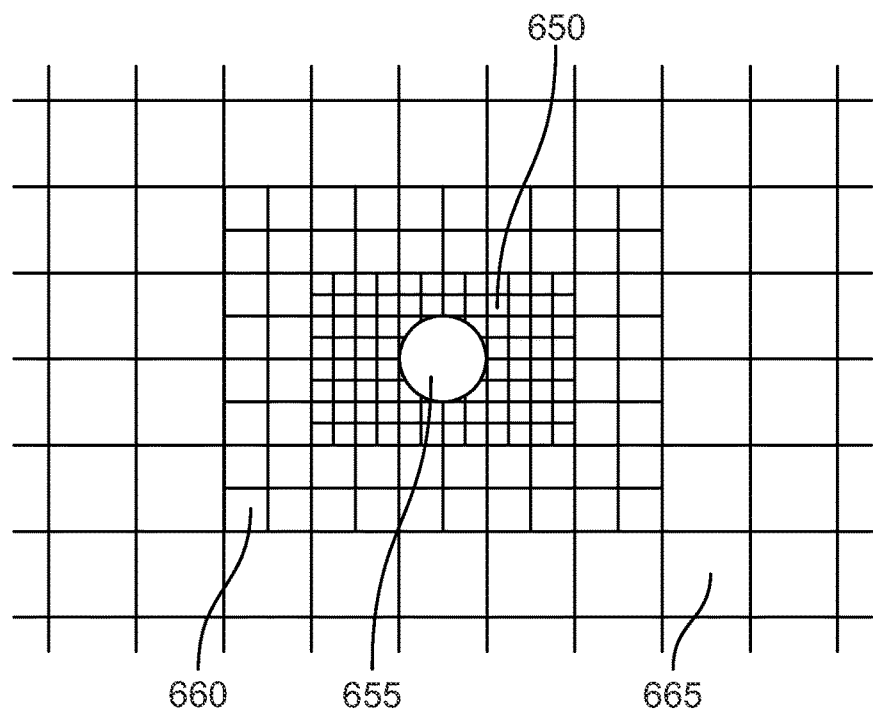
FIGS. 9 and 10 illustrate variable resolution techniques.
Figure 10:
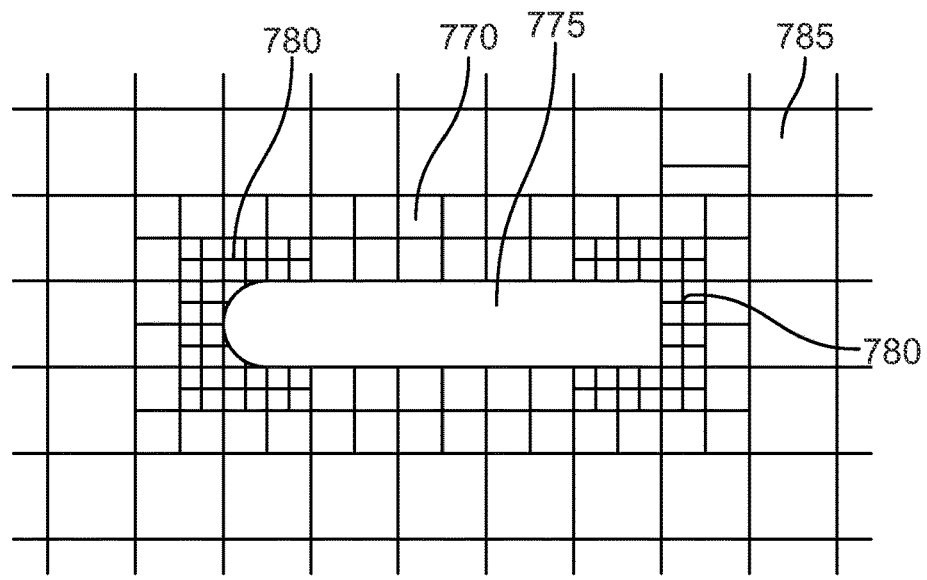

Referring to FIG. 9, different levels of resolution may be used in different regions of the simulation space to improve processing efficiency. Typically, the region 650 around an object 655 is of the most interest and is therefore simulated with the highest resolution. Because the effect of viscosity decreases with distance from the object, decreasing levels of resolution (i.e., expanded voxel volumes) are employed to simulate regions 660, 665 that are spaced at increasing distances from the object 655. Similarly, as illustrated in FIG. 10, a lower level of resolution may be used to simulate a region 770 around less significant features of an object 775 while the highest level of resolution is used to simulate regions 780 around the most significant features (e.g., the leading and trailing surfaces) of the object 775. Outlying regions 785 are simulated using the lowest level of resolution and the largest voxels.

C. Identify Voxels Affected by Facets

Referring again to FIG. 6, once the simulation space has been modeled (step 302), voxels affected by one or more facets are identified (step 304). Voxels may be affected by facets in a number of ways. First, a voxel that is intersected by one or more facets is affected in that the voxel has a reduced volume relative to non-intersected voxels. This occurs because a facet, and material underlying the surface represented by the facet, occupies a portion of the voxel. A fractional factor $P_f(x)$ indicates the portion of the voxel that is unaffected by the facet (i.e., the portion that can be occupied by a fluid or other materials for which flow is being simulated). For non-intersected voxels, $P_f(x)$ equals one.

Voxels that interact with one or more facets by transferring particles to the facet or receiving particles from the facet are also identified as voxels affected by the facets. All voxels that are intersected by a facet will include at least one state that receives particles from the facet and at least one state that transfers particles to the facet. In most cases, additional voxels also will include such states.

Figure 11:
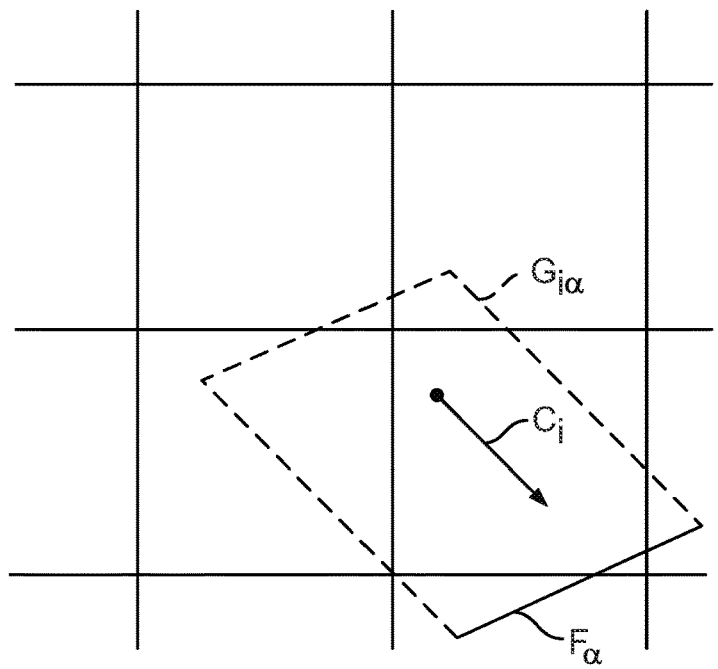
FIG. 11 illustrates regions affected by a facet of a surface.

Referring to FIG. 11, for each state i having a non-zero velocity vector $c_i$, a facet $F_\alpha$ receives particles from, or transfers particles to, a region defined by a parallelepiped $G_{i\alpha}$ having a height defined by the magnitude of the vector dot product of the velocity vector $c_i$ and the unit normal $n_\alpha$ of the facet ($|c_i n_i|$) and a base defined by the surface area $A_\alpha$ of the facet so that the volume $V_{i\alpha}$ of the parallelepiped $G_{i\alpha}$ equals:

$$V_{i\alpha} = |c_i n_\alpha| A_\alpha \qquad \text{Eq. (9)}$$

The facet $F_\alpha$ receives particles from the volume $V_{i\alpha}$ when the velocity vector of the state is directed toward the facet ($|c_i n_i| < 0$), and transfers particles to the region when the velocity vector of the state is directed away from the facet ($|c_i n_i| > 0$). As will be discussed below, this expression must be modified when another facet occupies a portion of the parallelepiped $G_{i\alpha}$, a condition that could occur in the vicinity of non-convex features such as interior corners.

The parallelepiped $G_{i\alpha}$ of a facet $F_\alpha$ may overlap portions or all of multiple voxels. The number of voxels or portions thereof is dependent on the size of the facet relative to the size of the voxels, the energy of the state, and the orientation of the facet relative to the lattice structure. The number of affected voxels increases with the size of the facet. Accordingly, the size of the facet, as noted above, is typically selected to be on the order of or smaller than the size of the voxels located near the facet.

The portion of a voxel N(x) overlapped by a parallelepiped $G_{i\alpha}$ is defined as $V_{i\alpha}(x)$. Using this term, the flux $\Gamma_{i\alpha}(x)$ of state i particles that move between a voxel N(x) and a facet $F_\alpha$ equals the density of state i particles in the voxel ($N_i(x)$) multiplied by the volume of the region of overlap with the voxel ($V_{i\alpha}(x)$):

$$\Gamma_{i\alpha}(x) = N_i(x) V_{i\alpha}(x). \qquad \text{Eq. (10)}$$

When the parallelepiped $G_{i\alpha}$ is intersected by one or more facets, the following condition is true:

$$V_{i\alpha} = \Sigma V_\alpha(x) + \Sigma V_{i\alpha}(\beta) \qquad \text{Eq. (11)}$$

where the first summation accounts for all voxels overlapped by $G_{i\alpha}$ and the second term accounts for all facets that intersect $G_{i\alpha}$. When the parallelepiped $G_{i\alpha}$ is not intersected by another facet, this expression reduces to:

$$V_{i\alpha} = \Sigma V_{i\alpha}(x). \qquad \text{Eq. (12)}$$

D. Perform Simulation

Once the voxels that are affected by one or more facets are identified (step 304), a timer is initialized to begin the simulation (step 306). During each time increment of the simulation, movement of particles from voxel to voxel is simulated by an advection stage (steps 308-316) that accounts for interactions of the particles with surface facets. Next, a collision stage (step 318) simulates the interaction of particles within each voxel. Thereafter, the timer is incremented (step 320). If the incremented timer does not indicate that the simulation is complete (step 322), the advection and collision stages (steps 308-320) are repeated. If the incremented timer indicates that the simulation is complete (step 322), results of the simulation are stored and/or displayed (step 324).

1. Boundary Conditions for Surface

To correctly simulate interactions with a surface, each facet must meet four boundary conditions. First, the combined mass of particles received by a facet must equal the combined mass of particles transferred by the facet (i.e., the net mass flux to the facet must equal zero). Second, the combined energy of particles received by a facet must equal the combined energy of particles transferred by the facet (i.e., the net energy flux to the facet must equal zero). These two conditions may be satisfied by requiring the net mass flux at each energy level (i.e., energy levels one and two) to equal zero.

The other two boundary conditions are related to the net momentum of particles interacting with a facet. For a surface with no skin friction, referred to herein as a slip surface, the net tangential momentum flux must equal zero and the net normal momentum flux must equal the local pressure at the facet. Thus, the components of the combined received and transferred momentums that are perpendicular to the normal n, of the facet (i.e., the tangential components) must be equal, while the difference between the components of the combined received and transferred momentums that are parallel to the normal n, of the facet (i.e., the normal components) must equal the local pressure at the facet. For non-slip surfaces, friction of the surface reduces the combined tangential momentum of particles transferred by the facet relative to the combined tangential momentum of particles received by the facet by a factor that is related to the amount of friction.

2. Gather from Voxels to Facets

As a first step in simulating interaction between particles and a surface, particles are gathered from the voxels and provided to the facets (step 308). As noted above, the flux of state i particles between a voxel N(x) and a facet $F_\alpha$ is:

$$\Gamma_{i\alpha}(x) = N_i(x) V_{i\alpha}(x). \qquad \text{Eq. (13)}$$

From this, for each state i directed toward a facet $F_\alpha(c_i n_\alpha < 0)$, the number of particles provided to the facet $F_\alpha$ by the voxels is:

$$\Gamma_{i\alpha V \to F} = \sum_x \Gamma_{i\alpha}(x) \qquad \text{Eq. (14)}$$

$$= \sum_x N_i(x) V_{i\alpha}(x)$$

Only voxels for which $V_{i\alpha}(x)$ has a non-zero value must be summed. As noted above, the size of the facets is selected so that $V_{i\alpha}(x)$ has a non-zero value for only a small number of voxels. Because $V_{i\alpha}(x)$ and $P_f(x)$ may have non-integer values, $\Gamma_\alpha(x)$ is stored and processed as a real number.

3. Move from Facet to Facet

Figure 13:
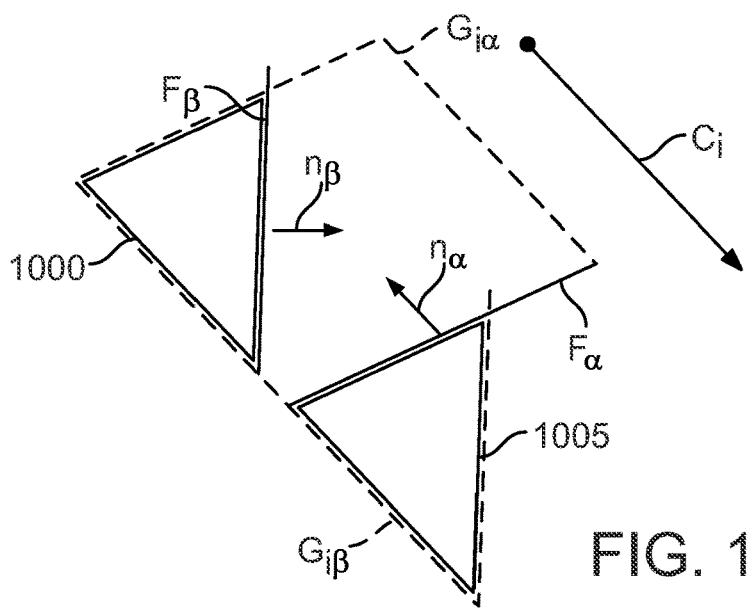
FIG. 13 illustrates movement of particles from a surface to a surface.

Next, particles are moved between facets (step 310). If the parallelepiped $G_{i\alpha}$ for an incoming state ($c_i n_\alpha < 0$) of a facet $F_\alpha$ is intersected by another facet $F_\beta$, then a portion of the state i particles received by the facet $F_\alpha$ will come from the facet $F_\beta$. In particular, facet $F_\alpha$ will receive a portion of the state i particles produced by facet $F_\beta$ during the previous time increment. This relationship is illustrated in FIG. 13, where a portion 1000 of the parallelepiped $G_{i\alpha}$ that is intersected by facet $F_p$ equals a portion 1005 of the parallelepiped $G_{i\beta}$ that is intersected by facet $F_\alpha$. As noted above, the intersected portion is denoted as $V_{i\alpha}(\beta)$. Using this term, the flux of state i particles between a facet $F_\beta$ and a facet $F_\alpha$ may be described as:

$$\Gamma_{i\alpha}(\beta, t-1) = \Gamma_i(\beta) V_{i\alpha}(\beta) / V_{i\alpha} \qquad \text{Eq. (15)}$$

where $\Gamma_i(\beta, t-1)$ is a measure of the state i particles produced by the facet $F_\beta$ during the previous time increment. From this, for each state i directed toward a facet $F_\alpha(c_i n_\alpha<0)$, the number of particles provided to the facet $F_\alpha$ by the other facets is:

$$\Gamma_{i\alpha F \to F} = \sum_\beta \Gamma_{i\alpha}(\beta) \qquad \text{Eq. (16)}$$

$$= \sum_\beta \Gamma_i(\beta, t-1) V_{i\alpha}(\beta)/V_{i\alpha}$$

and the total flux of state i particles into the facet is:

$$\Gamma_{iIN}(\alpha) = \Gamma_{i\alpha V \to F} + \Gamma_{i\alpha F \to F} \qquad \text{Eq. (17)}$$

$$= \sum_x N_i(x) V_{i\alpha}(x) + \sum_\beta \Gamma_i(\beta, t-1) V_{i\alpha}(\beta)/V_{i\alpha}$$

The state vector $N(\alpha)$ for the facet, also referred to as a facet distribution function, has M entries corresponding to the M entries of the voxel states vectors. M is the number of discrete lattice speeds. The input states of the facet distribution function $N(\alpha)$ are set equal to the flux of particles into those states divided by the volume $V_{i\alpha}$:

$$N_i(\alpha) = \Gamma_{iIN}(\alpha)/V_{i\alpha} \qquad \text{Eq. (18)}$$

for $c_i n_\alpha < 0$.

The facet distribution function is a simulation tool for generating the output flux from a facet, and is not necessarily representative of actual particles. To generate an accurate output flux, values are assigned to the other states of the distribution function. Outward states are populated using the technique described above for populating the inward states:

$$N_i(\alpha) = \Gamma_{iOTHER}(\alpha)/V \qquad \text{Eq. (19)}$$

for $c_i n_\alpha \geq 0$, wherein $\Gamma_{iOTHER}(\alpha)$ is determined using the technique described above for generating $\Gamma_{iIN}(\alpha)$, but applying the technique to states ($c_i n_\alpha \geq 0$) other than incoming states ($c_i n_\alpha < 0$). In an alternative approach, $\Gamma_{iOTHER}(\alpha)$ may be generated using values of $\Gamma_{iOUT}(\alpha)$ from the previous time step so that:

$$\Gamma_{iOTHER}(\alpha,t) = \Gamma_{iOUT}(\alpha,t-1). \qquad \text{Eq. (20)}$$

For parallel states ($c_i n_\alpha = 0$), both $V_{i\alpha}$ and $V_{i\alpha}(x)$ are zero. In the expression for $N_i(\alpha)$, $V_{i\alpha}(x)$ appears in the numerator (from the expression for $\Gamma_{iOTHER}(\alpha)$ and $V_{i\alpha}$ appears in the denominator (from the expression for $N_i(\alpha)$). Accordingly, $N_i(\alpha)$ for parallel states is determined as the limit of $N_i(\alpha)$ as $V_{i\alpha}$ and $V_{i\alpha}(x)$ approach zero.

The values of states having zero velocity (i.e., rest states and states (0, 0, 0, 2) and (0, 0, 0, −2)) are initialized at the beginning of the simulation based on initial conditions for temperature and pressure. These values are then adjusted over time.

4. Perform Facet Surface Dynamics

Figure 14:
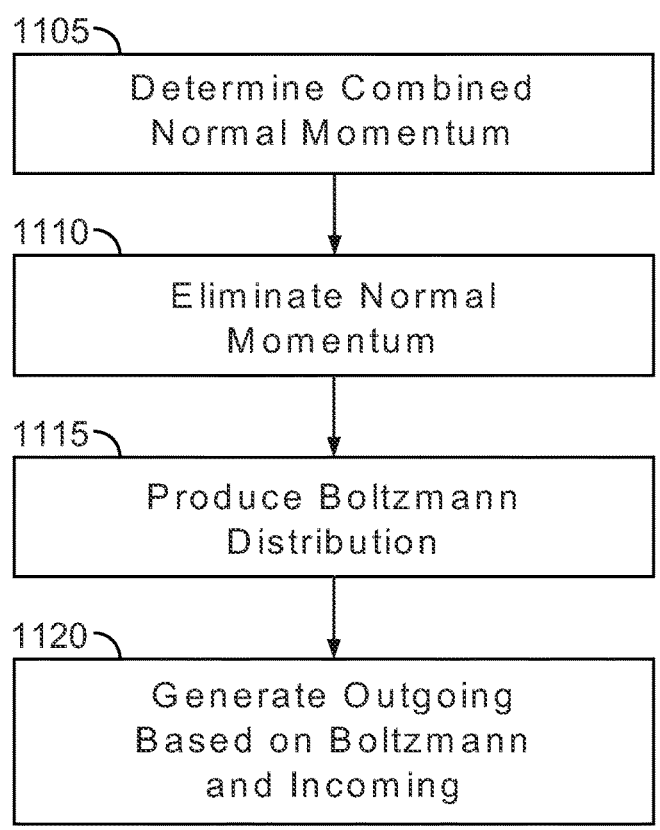
FIG. 14 is a flow chart of a procedure for performing surface dynamics.

Next, surface dynamics are performed for each facet to satisfy the four boundary conditions discussed above (step 312). A procedure for performing surface dynamics for a facet is illustrated in FIG. 14. Initially, the combined momentum normal to the facet $F_\alpha$ is determined (step 1105) by determining the combined momentum $P(\alpha)$ of the particles at the facet as:

$$P(\alpha) = \sum_i c_i * N_i^\alpha \qquad \text{Eq. (21)}$$

for all i. From this, the normal momentum $P_n(\alpha)$ is determined as:

$$P_n(\alpha) = n_\alpha \cdot P(\alpha). \qquad \text{Eq. (22)}$$

This normal momentum is then eliminated using a pushing/pulling technique (step 1110) to produce $N_{n-}(\alpha)$. According to this technique, particles are moved between states in a way that affects only normal momentum. The pushing/pulling technique is described in U.S. Pat. No. 5,594,671, which is incorporated by reference.

Thereafter, the particles of $N_{n-}(\alpha)$ are collided to produce a Boltzmann distribution $N_{n-\beta}(\alpha)$ (step 1115). As described below with respect to performing fluid dynamics, a Boltzmann distribution may be achieved by applying a set of collision rules to $N_{n-}(\alpha)$.

An outgoing flux distribution for the facet $F_\alpha$ is then determined (step 1120) based on the incoming flux distribution and the Boltzmann distribution. First, the difference between the incoming flux distribution $\Gamma_i(\alpha)$ and the Boltzmann distribution is determined as:

$$\Delta\Gamma_i(\alpha) = \Gamma_{iIN}(\alpha) - N_{n-\beta i}(\alpha) V_{i\alpha} \qquad \text{Eq. (23)}$$

Using this difference, the outgoing flux distribution is:

$$\Gamma_{iOUT}(\alpha) = N_{n-\beta i}(\alpha) V_{i\alpha} - \Delta\Gamma_{i*}(\alpha), \qquad \text{Eq. (24)}$$

for $n_\alpha c_i > 0$ and where $i^*$ is the state having a direction opposite to state i. For example, if state i is (1, 1, 0, 0), then state $i^*$ is (−1, −1, 0, 0). To account for skin friction and other factors, the outgoing flux distribution may be further refined to:

$$\Gamma_{iOUT}(\alpha) = N_{n-Bi}(\alpha) V_{i\alpha} - \Delta\Gamma_{i*}(\alpha) + C_f(n_\alpha \cdot c_i)[N_{n-Bi*}(\alpha) - N_{n-Bi}(\alpha)] V_{i\alpha} + (n_\alpha \cdot c_i)(t_{1\alpha} \cdot c_i) \Delta N_{j,1} V_{i\alpha} + (n_\alpha \cdot c_i)(t_{2\alpha} \cdot c_i) \Delta N_{j,2} V_{i\alpha} \qquad \text{Eq. (25)}$$

for $n_\alpha c_i > 0$, where $c_f$ is a function of skin friction, $t_{i\alpha}$ is a first tangential vector that is perpendicular to $n_\alpha$, $t_{2\alpha}$ is a second tangential vector that is perpendicular to both $n_\alpha$ and $t_{1\alpha}$, and $\Delta N_{j,1}$ and $\Delta N_{j,2}$ are distribution functions corresponding to the energy (j) of the state i and the indicated tangential vector. The distribution functions are determined according to:

$$\Delta N_{j,1,2} = -\frac{1}{2j^2}\left(n_\alpha \cdot \sum_i c_i c_i N_{n-Bi}(\alpha) \cdot t_{1,2\alpha}\right) \qquad \text{Eq. (26)}$$

where j equals 1 for energy level 1 states and 2 for energy level 2 states.

The functions of each term of the equation for $\Gamma_{iOUT}(\alpha)$ are as follows. The first and second terms enforce the normal momentum flux boundary condition to the extent that collisions have been effective in producing a Boltzmann distribution, but include a tangential momentum flux anomaly. The fourth and fifth terms correct for this anomaly, which may arise due to discreteness effects or non-Boltzmann structure due to insufficient collisions. Finally, the third term adds a specified amount of skin fraction to enforce a desired change in tangential momentum flux on the surface. Generation of the friction coefficient $C_f$ is described below. Note that all terms involving vector manipulations are geometric factors that may be calculated prior to beginning the simulation.

From this, a tangential velocity is determined as:

$$u_i(\alpha) = (P(\alpha) - P_n(\alpha)n_\alpha)/\rho,\qquad \text{Eq. (27)}$$

where $\rho$ is the density of the facet distribution:

$$\rho = \sum_i N_i(\alpha) \qquad \text{Eq. (28)}$$

As before, the difference between the incoming flux distribution and the Boltzmann distribution is determined as:

$$\Delta\Gamma_i(\alpha) = \Gamma_{iIN}(\alpha) - N_{n-\beta i}(\alpha)V_{i\alpha} \qquad \text{Eq. (29)}$$

The outgoing flux distribution then becomes:

$$\Gamma_{iOUT}(\alpha) = N_{n-\beta i}(\alpha)V_{i\alpha} - \Delta\Gamma_{i*}(\alpha) + C_f(n_\alpha c_i)[N_{n-\beta i*}(\alpha) - N_{n-\beta i}(\alpha)]V_{i\alpha} \qquad \text{Eq. (30)}$$

which corresponds to the first two lines of the outgoing flux distribution determined by the previous technique but does not require the correction for anomalous tangential flux.

Using either approach, the resulting flux-distributions satisfy all of the momentum flux conditions, namely:

$$\sum_{i, c_i \cdot n_\alpha > 0} c_i \Gamma_{i\alpha OUT} - \sum_{i, c_i \cdot n_\alpha < 0} c_i \Gamma_{i\alpha IN} = p_\alpha n_\alpha A_\alpha - C_f \rho_\alpha u_\alpha A_\alpha \qquad \text{Eq. (31)}$$

where $\beta_\alpha$ is the equilibrium pressure at the facet $F_\alpha$ and is based on the averaged density and temperature values of the voxels that provide particles to the facet, and $u_\alpha$ is the average velocity at the facet.

To ensure that the mass and energy boundary conditions are met, the difference between the input energy and the output energy is measured for each energy level jas:

$$\Delta\Gamma_{\alpha m j} = \sum_{i, c_{ji} \cdot n_\alpha < 0} \Gamma_{\alpha j i IN} - \sum_{i, c_{ji} \cdot n_\alpha > 0} c_i \Gamma_{\alpha j i OUT}$$

where the index j denotes the energy of the state i. This energy difference is then used to generate a difference term:

$$\delta\Gamma_{\alpha j i} = V_{i\alpha}\Delta\Gamma_{\alpha m j} \Big/ \sum_{i, c_{ji} \cdot n_\alpha < 0} V_{i\alpha} \qquad \text{Eq. (33)}$$

for $c_{ji} n_\alpha > 0$. This difference term is used to modify the outgoing flux so that the flux becomes:

$$\Gamma_{\alpha j i OUTf} = \Gamma_{\alpha j i OUT} + \delta\Gamma_{\alpha j i} \qquad \text{Eq. (34)}$$

for $c_{ji} n_\alpha > 0$. This operation corrects the mass and energy flux while leaving the tangential momentum flux unaltered. This adjustment is small if the flow is approximately uniform in the neighborhood of the facet and near equilibrium. The resulting normal momentum flux, after the adjustment, is slightly altered to a value that is the equilibrium pressure based on the neighborhood mean properties plus a correction due to the non-uniformity or non-equilibrium properties of the neighborhood.

5. Move from Voxels to Voxels

Referring again to FIG. 6, particles are moved between voxels along the three-dimensional rectilinear lattice (step 314). This voxel to voxel movement is the only movement operation performed on voxels that do not interact with the facets (i.e., voxels that are not located near a surface). In typical simulations, voxels that are not located near enough to a surface to interact with the surface constitute a large majority of the voxels.

Each of the separate states represents particles moving along the lattice with integer speeds in each of the three dimensions: x, y, and z. The integer speeds include: 0, ±1, and ±2. The sign of the speed indicates the direction in which a particle is moving along the corresponding axis.

For voxels that do not interact with a surface, the move operation is computationally quite simple. The entire population of a state is moved from its current voxel to its destination voxel during every time increment. At the same time, the particles of the destination voxel are moved from that voxel to their own destination voxels. For example, an energy level 1 particle that is moving in the +1x and +1y direction (1, 0, 0) is moved from its current voxel to one that is +1 over in the x direction and 0 for other direction. The particle ends up at its destination voxel with the same state it had before the move (1, 0, 0). Interactions within the voxel will likely change the particle count for that state based on local interactions with other particles and surfaces. If not, the particle will continue to move along the lattice at the same speed and direction.

Figure 12:
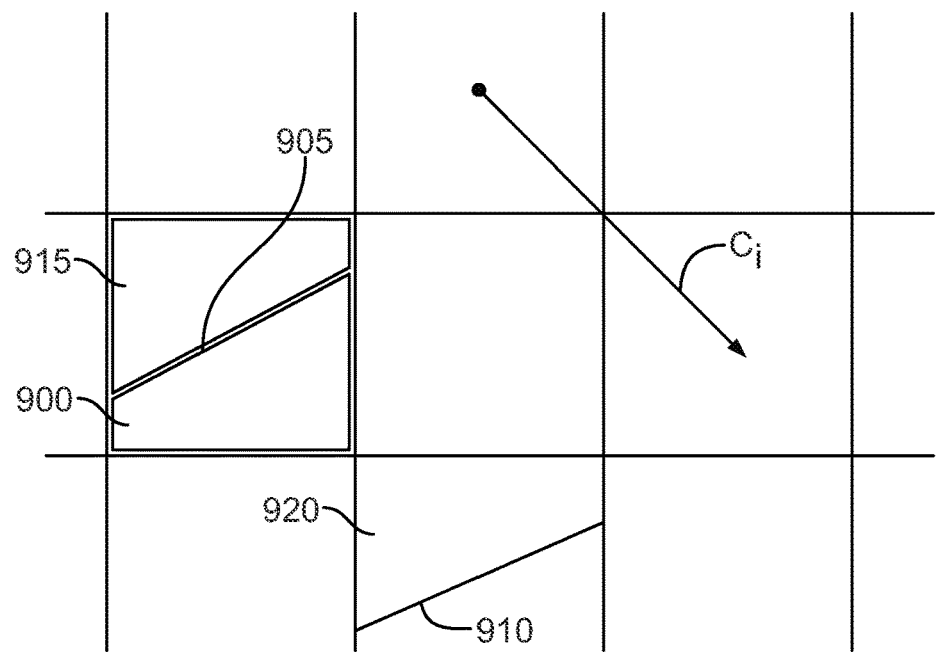
FIG. 12 illustrates movement of particles from a voxel to a surface.

The move operation becomes slightly more complicated for voxels that interact with one or more surfaces. This can result in one or more fractional particles being transferred to a facet. Transfer of such fractional particles to a facet results in fractional particles remaining in the voxels. These fractional particles are transferred to a voxel occupied by the facet. For example, referring to FIG. 12, when a portion 900 of the state i particles for a voxel 905 is moved to a facet 910 (step 308), the remaining portion 915 is moved to a voxel 920 in which the facet 910 is located and from which particles of state i are directed to the facet 910. Thus, if the state population equaled 25 and $V_{i\alpha}(x)$ equaled 0.25 (i.e., a quarter of the voxel intersects the parallelepiped $G_{i\alpha}$), then 6.25 particles would be moved to the facet $F_\alpha$ and 18.75 particles would be moved to the voxel occupied by the facet $F_\alpha$. Because multiple facets could intersect a single voxel, the number of state i particles transferred to a voxel N(f) occupied by one or more facets is:

$$N_i(f) = N_i(x)\left(1 - \sum_\alpha V_{i\alpha}(x)\right) \qquad \text{Eq. (35)}$$

where N(x) is the source voxel.

6. Scatter from Facets to Voxels

Next, the outgoing particles from each facet are scattered to the voxels (step 316). Essentially, this step is the reverse of the gather step by which particles were moved from the voxels to the facets. The number of state i particles that move from a facet $F_\alpha$ to a voxel N(x) is:

$$N_{\alpha i F \to V} = \frac{1}{P_f(x)} V_{\alpha i}(x)\Gamma_{\alpha i OUTf}/V_{\alpha i} \qquad \text{Eq. (36)}$$

where $P_f(x)$ accounts for the volume reduction of partial voxels. From this, for each state i, the total number of particles directed from the facets to a voxel $N_{(x)}$ is:

$$N_{iF \to V} = \frac{1}{P_f(x)} \sum_{\alpha} V_{\alpha i}(x) \Gamma_{\alpha iOUT_f} / V_{\alpha i} \qquad \text{Eq. (37)}$$

After scattering particles from the facets to the voxels, combining them with particles that have advected in from surrounding voxels, and integerizing the result, it is possible that certain directions in certain voxels may either underflow (become negative) or overflow (exceed 255 in an eight-bit implementation). This would result in either a gain or loss in mass, momentum and energy after these quantities are truncated to fit in the allowed range of values. To protect against such occurrences, the mass, momentum and energy that are out of bounds are accumulated prior to truncation of the offending state. For the energy to which the state belongs, an amount of mass equal to the value gained (due to underflow) or lost (due to overflow) is added back to randomly (or sequentially) selected states having the same energy and that are not themselves subject to overflow or underflow. The additional momentum resulting from this addition of mass and energy is accumulated and added to the momentum from the truncation. By only adding mass to the same energy states, both mass and energy are corrected when the mass counter reaches zero. Finally, the momentum is corrected using pushing/pulling techniques until the momentum accumulator is returned to zero.

7. Perform Fluid Dynamics

Finally, fluid dynamics are performed (step 318). This step may be referred to as microdynamics or intravoxel operations. Similarly, the advection procedure may be referred to as intervoxel operations. The microdynamics operations described below may also be used to collide particles at a facet to produce a Boltzmann distribution.

The fluid dynamics is ensured in the lattice Boltzmann equation models by a particular collision operator known as the BGK collision model. This collision model mimics the dynamics of the distribution in a real fluid system. The collision process can be well described by the right-hand side of Equation 1 and Equation 2. After the advection step, the conserved quantities of a fluid system, specifically the density, momentum and the energy are obtained from the distribution function using Equation 3. From these quantities, the equilibrium distribution function, noted by $f^{eq}$ in equation (2), is fully specified by Equation (4). The choice of the velocity vector set $c_i$, the weights, both are listed in Table 1, together with Equation 2 ensures that the macroscopic behavior obeys the correct hydrodynamic equation.

E. Variable Resolution

Figure 15:
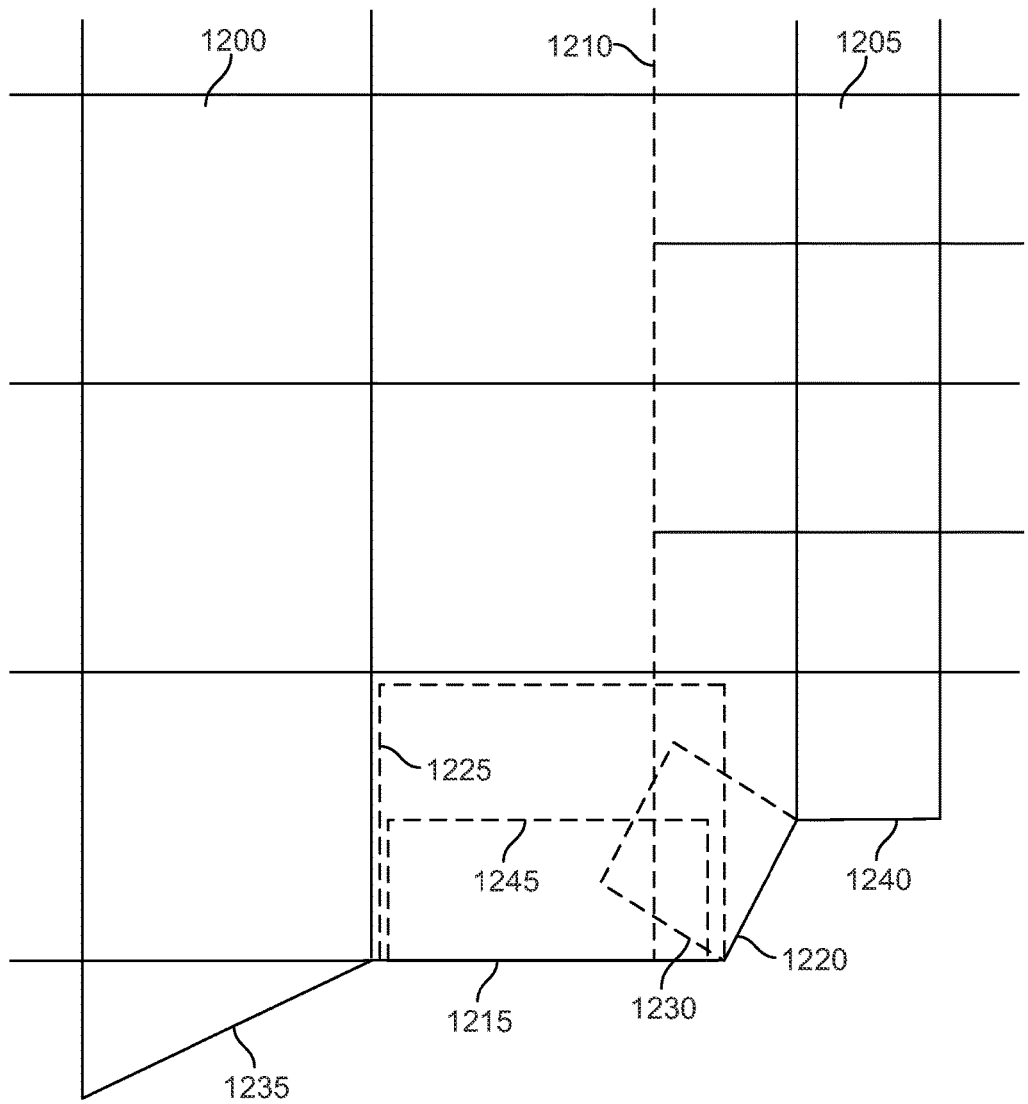
FIG. 15 illustrates an interface between voxels of different sizes.

Referring to FIG. 15, variable resolution (as illustrated in FIGS. 9 and 10 and discussed above) employs voxels of different sizes, hereinafter referred to as coarse voxels 1200 and fine voxels 1205. (The following discussion refers to voxels having two different sizes; it should be appreciated that the techniques described may be applied to three or more different sizes of voxels to provide additional levels of resolution.) The interface between regions of coarse and fine voxels is referred to as a variable resolution (VR) interface 1210.

When variable resolution is employed at or near a surface, facets may interact with voxels on both sides of the VR interface. These facets are classified as VR interface facets 1215 ($F_{\alpha IC}$) or VR fine facets 1220 ($F_{\alpha IF}$). A VR interface facet 1215 is a facet positioned on the coarse side of the VR interface and having a coarse parallelepiped 1225 extending into a fine voxel. (A coarse parallelepiped is one for which $c_i$ is dimensioned according to the dimensions of a coarse voxel, while a fine parallelepiped is one for which $c_i$ is dimensioned according to the dimensions of a fine voxel.) A VR fine facet 1220 is a facet positioned on the fine side of the VR interface and having a fine parallelepiped 1230 extending into a coarse voxel. Processing related to interface facets may also involve interactions with coarse facets 1235 ($F_{\alpha C}$) and fine facets 1240 ($F_{\alpha F}$).

For both types of VR facets, surface dynamics are performed at the fine scale, and operate as described above. However, VR facets differ from other facets with respect to the way in which particles advect to and from the VR facets.

Figure 16:
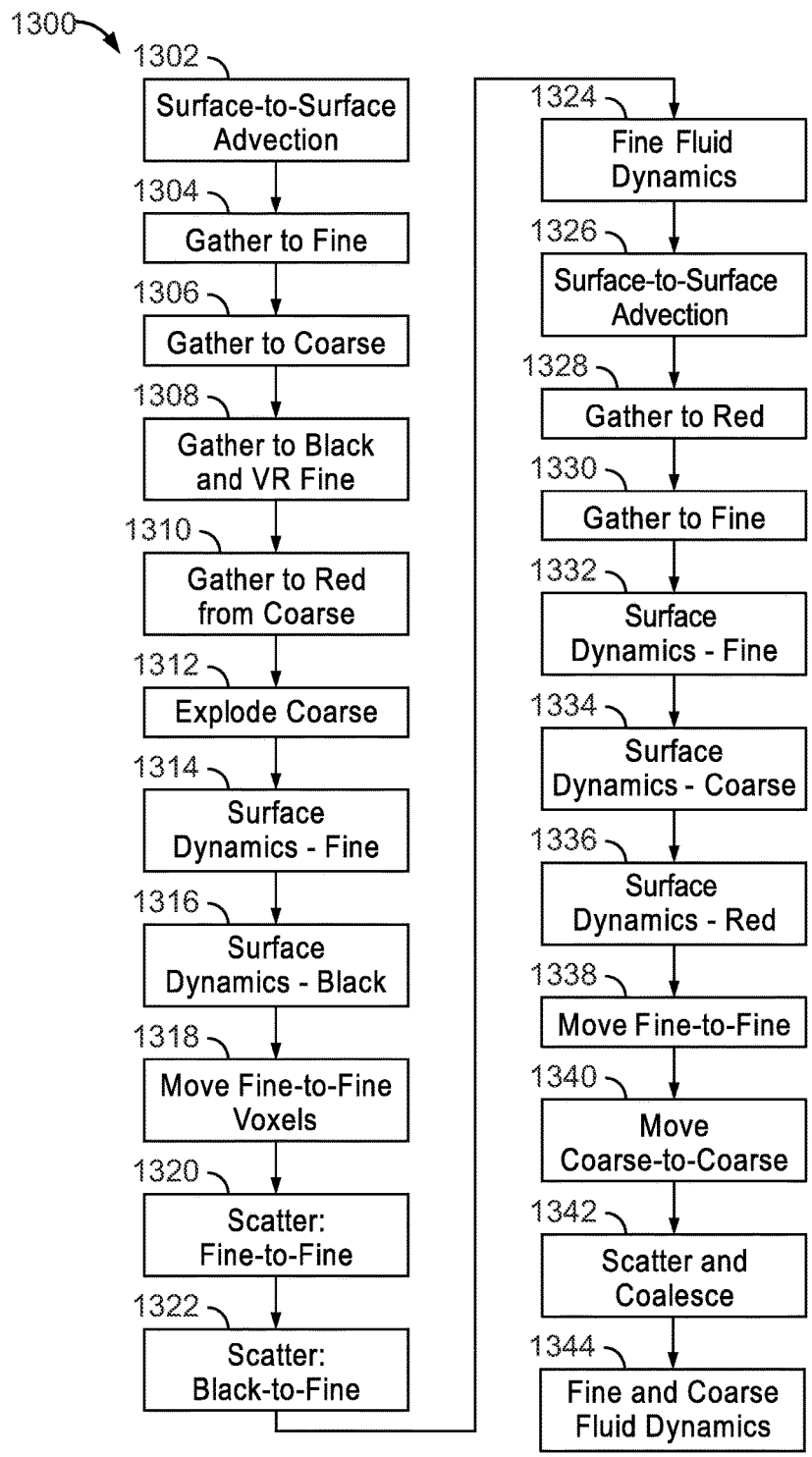
FIG. 16 is a flow chart of a procedure for simulating interactions with facets under variable resolution conditions.

Interactions with VR facets are handled using a variable resolution procedure 1300 illustrated in FIG. 16. Most steps of this procedure are carried out using the comparable steps discussed above for interactions with non-VR facets. The procedure 1300 is performed during a coarse time step (i.e., a time period corresponding to a coarse voxel) that includes two phases that each correspond to a fine time step. The facet surface dynamics are performed during each fine time step. For this reason, a VR interface facet $F_{\alpha IC}$ is considered as two identically sized and oriented fine facets that are referred to, respectively, as a black facet $F_{\alpha ICb}$ and a red facet $F_{\alpha ICr}$. The black facet $F_{\alpha ICb}$ is associated with the first fine time step within a coarse time step while the red facet $F_{\alpha ICr}$ is associated with the second fine time step within a coarse time step.

Initially, particles are moved (advected) between facets by a first surface-to-surface advection stage (step 1302). Particles are moved from black facets $F_{\alpha ICb}$ to coarse facets $F_{\beta C}$ with a weighting factor of $V_{-\alpha\beta}$ that corresponds to the volume of the unblocked portion of the coarse parallelepiped (FIG. 15, 1225) that extends from a facet $F_{\alpha}$ and that lies behind a facet $F_{\beta}$ less the unblocked portion of the fine parallelepiped (FIG. 15, 1245) that extends from the facet $F_{\alpha}$ and that lies behind the facet $F_{\beta}$. The magnitude of $c_i$ for a fine voxel is one half the magnitude of $c_i$ for a coarse voxel. As discussed above, the volume of a parallelepiped for a facet $F_{\alpha}$ is defined as:

$$V_{i\alpha} = |c_i n_\alpha| A_\alpha \qquad \text{Eq. (38)}$$

Accordingly, because the surface area $A_{\alpha}$ of a facet does not change between coarse and fine parallelepipeds, and because the unit normal $n_{\alpha}$ always has a magnitude of one, the volume of a fine parallelepiped corresponding to a facet is one half the volume of the corresponding coarse parallelepiped for the facet.

Particles are moved from coarse facets $F_{\alpha C}$ to black facets $F_{\beta ICb}$ with a weighting factor of $V_{\alpha\beta}$ that corresponds to the volume of the unblocked portion of the fine parallelepiped that extends from a facet $F_{\alpha}$ and that lies behind a facet $F_{\beta}$.

Particles are moved from red facets $F_{\alpha ICr}$ to coarse facets $F_{\beta C}$ with a weighting factor of $V_{\alpha\beta}$, and from coarse facets $F_{\alpha C}$ to red facets $F_{\alpha ICr}$ with a weighting factor of $V_{-\alpha\beta}$.

Particles are moved from red facets $F_{\alpha ICr}$ to black facets $F_{\alpha ICb}$ with a weighting factor of $V_{\alpha\beta}$. In this stage, black-to-red advections do not occur. In addition, because the black and red facets represent consecutive time steps, black-to-black advections (or red-to-red advections) never occur. For similar reasons, particles in this stage are moved from red facets $F_{\alpha ICr}$ to fine facets $F_{\beta IF}$ or $F_{\beta F}$ with a weighting factor of $V_{\alpha\beta}$, and from fine facets $F_{\alpha IF}$ or $F_{\alpha F}$ to black facets $F_{\alpha ICb}$ with the same weighting factor.

Finally, particles are moved from fine facets $F_{\alpha IF}$ or $F_{\alpha F}$ to other fine facets $F_{\beta IF}$ or $F_{\beta F}$ with the same weighting factor, and from coarse facets $F_{\alpha C}$ to other coarse facets $F_C$ with a weighting factor of $V_{C\alpha\beta}$ that corresponds to the volume of the unblocked portion of the coarse parallelepiped that extends from a facet $F_\alpha$ and that lies behind a facet $F_\beta$.

After particles are advected between surfaces, particles are gathered from the voxels in a first gather stage (steps 1304-1310). Particles are gathered for fine facets $F_{\alpha F}$ from fine voxels using fine parallelepipeds (step 1304), and for coarse facets $F_{\alpha C}$ from coarse voxels using coarse parallelepipeds (step 1306). Particles are then gathered for black facets $F_{\alpha IRb}$ and for VR fine facets $F_{\alpha IF}$ from both coarse and fine voxels using fine parallelepipeds (step 1308). Finally, particles are gathered for red facets $F_{\alpha IRr}$ from coarse voxels using the differences between coarse parallelepipeds and fine parallelepipeds (step 1310).

Next, coarse voxels that interact with fine voxels or VR facets are exploded into a collection of fine voxels (step 1312). The states of a coarse voxel that will transmit particles to a fine voxel within a single coarse time step are exploded. For example, the appropriate states of a coarse voxel that is not intersected by a facet are exploded into eight fine voxels oriented like the microblock of FIG. 7. The appropriate states of coarse voxel that is intersected by one or more facets are exploded into a collection of complete and/or partial fine voxels corresponding to the portion of the coarse voxel that is not intersected by any facets. The particle densities $N_i(x)$ for a coarse voxel and the fine voxels resulting from the explosion thereof are equal, but the fine voxels may have fractional factors $P_f$ that differ from the fractional factor of the coarse voxel and from the fractional factors of the other fine voxels.

Thereafter, surface dynamics are performed for the fine facets $F_{\alpha IF}$ and F (step 1314), and for the black facets $F_{\alpha ICb}$ (step 1316). Dynamics are performed using the procedure illustrated in FIG. 14 and discussed above.

Next, particles are moved between fine voxels (step 1318) including actual fine voxels and fine voxels resulting from the explosion of coarse voxels. Once the particles have been moved, particles are scattered from the fine facets $F_{\alpha IF}$ and $F_{\alpha F}$ to the fine voxels (step 1320).

Particles are also scattered from the black facets $F_{\alpha ICb}$ to the fine voxels (including the fine voxels that result from exploding a coarse voxel) (step 1322). Particles are scattered to a fine voxel if the voxel would have received particles at that time absent the presence of a surface. In particular, particles are scattered to a voxel N(x) when the voxel is an actual fine voxel (as opposed to a fine voxel resulting from the explosion of a coarse voxel), when a voxel N(x+$c_i$) that is one velocity unit beyond the voxel N(x) is an actual fine voxel, or when the voxel N(x+$c_i$) that is one velocity unit beyond the voxel N(x) is a fine voxel resulting from the explosion of a coarse voxel.

Finally, the first fine time step is completed by performing fluid dynamics on the fine voxels (step 1324). The voxels for which fluid dynamics are performed do not include the fine voxels that result from exploding a coarse voxel (step 1312).

The procedure 1300 implements similar steps during the second fine time step. Initially, particles are moved between surfaces in a second surface-to-surface advection stage (step 1326). Particles are advected from black facets to red facets, from black facets to fine facets, from fine facets to red facets, and from fine facets to fine facets.

After particles are advected between surfaces, particles are gathered from the voxels in a second gather stage (steps 1328-1330). Particles are gathered for red facets $F_{\alpha IRr}$ from fine voxels using fine parallelepipeds (step 1328). Particles also are gathered for fine facets $F_{\alpha\beta}$ and $F_{\alpha IF}$ from fine voxels using fine parallelepipeds (step 1330).

Thereafter, surface dynamics are performed for the fine facets $F_{\alpha IF}$ and $F_{\alpha\beta}$ (step 1332), for the coarse facets $F_{\alpha C}$ (step 1134), and for the red facets $F_{\alpha ICr}$ (step 1336) as discussed above.

Next, particles are moved between voxels using fine resolution (step 1338) so that particles are moved to and from fine voxels and fine voxels representative of coarse voxels. Particles are then moved between voxels using coarse resolution (step 1340) so that particles are moved to and from coarse voxels.

Next, in a combined step, particles are scattered from the facets to the voxels while the fine voxels that represent coarse voxels (i.e., the fine voxels resulting from exploding coarse voxels) are coalesced into coarse voxels (step 1342). In this combined step, particles are scattered from coarse facets to coarse voxels using coarse parallelepipeds, from fine facets to fine voxels using fine parallelepipeds, from red facets to fine or coarse voxels using fine parallelepipeds, and from black facets to coarse voxels using the differences between coarse parallelepipeds and find parallelepipeds. Finally, fluid dynamics are performed for the fine voxels and the coarse voxels (step 1344).

F. Mass Exchange

As noted above, various types of LBM may be applied for solving fluid flows, which serve as the background for multi-species flow through porous media. In some systems, to achieve relative permeability predictions, a set of gravity driven periodic-setup simulations could be performed at different saturations using a mass sink/source method in which fluid mass is exchanged between the different species at certain locations. In this manner the saturation can be changed while much of the spatial distribution of the fluid species from the previous saturation condition remains unchanged; hence information from the simulation results at one saturation condition influences the simulation at another saturation condition. For example, if a simulation progresses for a period of time and then oil is exchanged for water at certain locations, this changes the saturation value, while the oil and water distribution at all other locations is preserved. More particularly, at each water saturation, the simulation will be run until the effective permeabilities converge. After convergence, the mass exchange will begin and the simulation will be run until the next desired water saturation level is achieved. Once the desired water saturation level is achieved, the last exchange will be turned off and the simulation will run until the effective permeabilities converge. Thus, the system alternates between a mass exchange simulation and a convergence simulation.

Figure 17:
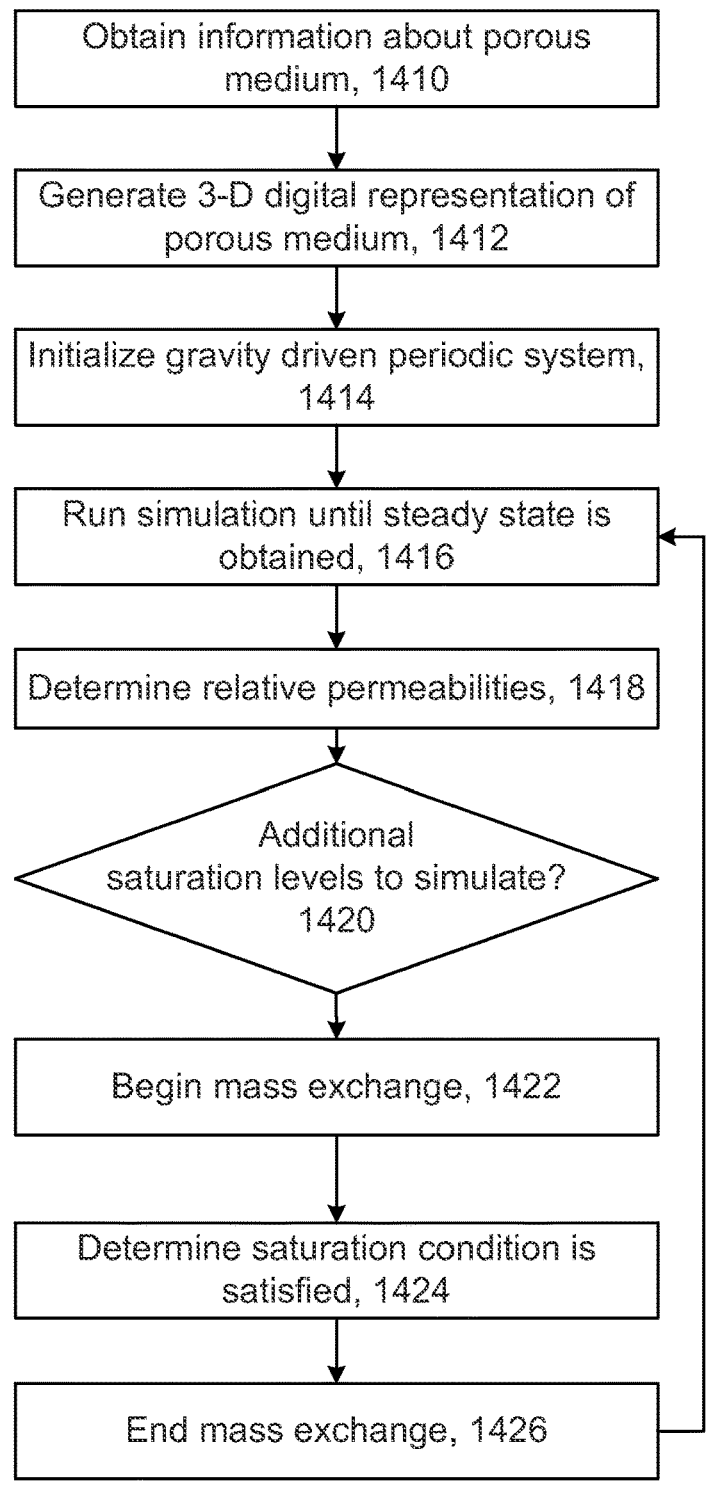
FIG. 17 is a flow chart of a procedure for determining relative permeabilities at different saturation levels.

FIG. 17 is a flow chart of an exemplary process for using a mass exchange process to modify the saturation value for a system during simulation of a multi-species flow through porous media. The process generates relative permeability predictions for the various saturation values. The relative permeability curves are an important input to estimate the productivity of a hydrocarbon reservoir. The two end-points, the irreducible water saturation (Swi) and the residual oil saturation (Sor), enable an estimation of the amount of oil which can be produced (by taking the difference in saturation values between Sor and Swi), as well as the amount of oil which cannot be extracted (Sor). The shape of the relative permeability curve, and the relation between the relative permeability curve of water and oil, provide knowledge as to how easy it is to move oil in the presence of water and are critical inputs to reservoir modeling systems used throughout the oil and gas industry.

The process begins with obtaining information about porous medium (1410) and generating a 3-D digital representation of porous medium (1412). For example, the porous media sample can be captured digitally, typically via a CT or micro-CT scanning process. Analysis and processing of the resulting images can be used to generate a three-dimensional digital representation of the porous medium geometry (e.g., a porous rock) for use in a numerical flow simulation.

The computer system then initializes the gravity driven periodic system (1414). In a gravity driven periodic system, a body force is applied in the desired flow direction to move the fluid through the simulation. Additionally, there is no inlet or outlet for the fluid to enter and exit, but rather the fluid leaving one end of the domain immediately enters at the other end. The system is also initialized to a particular saturation level or to a particular fluid distribution corresponding to a certain $S_w$. In order to connect inlet and outlet, the rock geometry is mirrored in the flow direction. This means that the pore space profile at the outlet is identical to the geometry of the inlet. There are two methods to start an imbibition type of relative permeability calculation. In this explanation, both methods assume water and oil to be the two immiscible fluids and the rock to be water wet. In the first method, the entire pore space is initialized with oil ($S_w=0\%$) and water is introduced into the rock using the mass sink/source exchange mechanism, such that Sw is increased incrementally. The irreducible water saturation is then determined as the saturation $S_w$ when the water flow rate first becomes non-zero. A more accurate approach is to perform a drainage simulation. In such a simulation a rock is initially fully saturated with water ($S_w=100\%$). Then, oil is pushed into the pore space on one side with an incrementally increasing pressure such that the final pressure corresponds to the pressure under reservoir conditions. The pressure at the inlet is increased in small increments in such a way that the oil intrusion comes to a rest (converges) before the next pressure increment is applied. The result of such a drainage test is a relation between the Capillary pressure and the corresponding water saturation. The water saturation at the largest pressure is considered to be the irreducible water saturation $S_w$, and can then be used as the starting point of a relative permeability test. The distribution of the water component can be used as the initial water distribution of the relative permeability test.

After initialization of the system, a simulation is executed until steady state is obtained (1416). The simulation typically starts with a saturation value at one extreme of the important saturation range. At this extreme saturation value typically only a single species is flowing through the porous media while the other species is present but motionless (trapped). When the simulation for this condition reaches a steady state, the relative permeabilities are determined (1418). The relative permeability of each component is calculated as the ratio of the effective permeability for that component divided by the absolute permeability:

$$k_{r,\alpha} = \frac{k_{eff,\alpha}}{k_0}$$

with α indicating the water or oil component. The absolute permeability can be determined in a single-phase flow simulation of the same rock geometry, or can be defined as the effective permeability at the irreducible water saturation $S_{wi}$. The equation for the effective permeability can be written as follows:

$$k_{eff,\alpha} = \mu_\alpha \cdot q_\alpha \cdot \frac{L}{\Delta P}.$$

Replacing the dynamic viscosity with the product of the kinematic viscosity and the density $\mu = v \cdot \rho$, and replacing the flux with the product of measured mean velocity in pore space with the porosity $q = u \cdot \Phi$, leads to $$k_{eff,\alpha} = \Phi \cdot u_\alpha \cdot \rho_\alpha \cdot v_\alpha \cdot \frac{L}{\Delta P}.$$

For gravity driven periodic systems, the pressure head $$\frac{\Delta P}{L}$$

can be replaced with the product of gravity and density:

$$\frac{\Delta P}{L} = \rho \cdot g.$$

Plugging this expression in the equation for the effective permeability leads to $$k_{eff,\alpha} = \Phi \cdot \frac{v_\alpha \cdot u_\alpha}{g}.$$

This equation is calculated for every voxel in the simulation domain and then averaged across the entire simulation domain.

The system then determines whether there are additional saturation levels to simulate (1420). If there are additional saturation levels to simulate, the system begins a process in which mass is exchanged between species 1422. In this process, at each mass exchange location, one species is removed and equal mass of the other species is injected. This mass exchange process changes the saturation from the starting value to a new value. One example of such an exchange process is described in more detail in relation to FIG. 18. In general, the mass exchange is done at appropriate high flow rate locations over a sufficient volume to achieve the next desired saturation condition (1424). When the saturation condition is satisfied, the mass exchange is turned off (1426) and the simulation is continued until again reaching steady state (1416).

The saturation is not updated each time step, rather, it is only updated after enough timesteps have run to reach convergence. This process is repeated over the desired set of saturation values. In this manner the systems and methods described herein allow the entire range of saturation values to be traversed while incorporating the influence of the fluid species distribution from one saturation value to the next. In this way, history effects are captured in the relative permeability results, allowing the simulation approach to more accurately reproduce what happens in the corresponding physical test situation. Given the potential for simulations predicting relative permeability to have lower cost and take less time than physical testing, a multi-species porous media simulation method employing the present mass sink/source process is expected to have value to the petroleum exploration and production industry.

In one particular example of an oil/water simulation, the mass exchange can be based on the following equations:

$$S_{oil} = -\alpha H(u - u_0)H(A - A_0)\rho$$

$$S_{water} = -S_{oil}$$

$$\rho = \rho_{oil}, \alpha > 0$$

$$\rho = \rho_{water}, \alpha \leq 0$$

$$A = \frac{\rho_{oil} - \rho_{water}}{\rho_{oil} + \rho_{water}}$$

The sink term for the oil component $S_{oil}$, is a function of the exchange rate α with the unit of 1/timesteps, a Heaviside function to control the threshold velocity, a Heaviside function to identify voxels belonging to the oil component using a Atwood number criterion, and the density of the oil component. A large exchange rate a will consequently lead to a larger fraction of exchanged mass per time step. The Heaviside function which is applied to the velocity vector ensures that a certain threshold velocity $u_0$ must be exceeded in order to identify that particular fluid volume as a volume which is part of a convection zone. The Atwood number is a parameter used to identify the components. It ranges between −1 and +1 corresponding to water and oil. The second Heaviside function ensures that the fluid volume which is considered for exchange is filled mostly with oil. The threshold value for the Atwood number $A_0$ is typically close to −1, e.g. smaller than 0.95. The magnitude of the mass source term of the water component $S_{water}$ is set equal to the magnitude of the mass sink term of the oil component multiplied by −1. However, in some examples the mass of the source term could instead be determined by a different constraint, for example, maintaining constant pressure per unit volume.

The choice of locations for the mass exchange in the simulated porous rock sample is important. In a physical steady-state relative permeability experiment, the saturation is set by injecting the corresponding combination of fluids into the porous media (i.e. with a mixture ratio that will result in the desired saturation value). For example, in what is termed an imbibition process, a rock sample initially filled mostly with oil is injected with a water and oil mixture having a mixture ratio with a higher volume fraction of water. This injection increases the saturation of water within the porous media by replacing some oil filled regions with water. In this physical situation, the porous media regions with the highest local flow rates are the first ones to have oil replaced by water, and over time the replacement happens also in regions with lower local flow rates.

Figure 18:
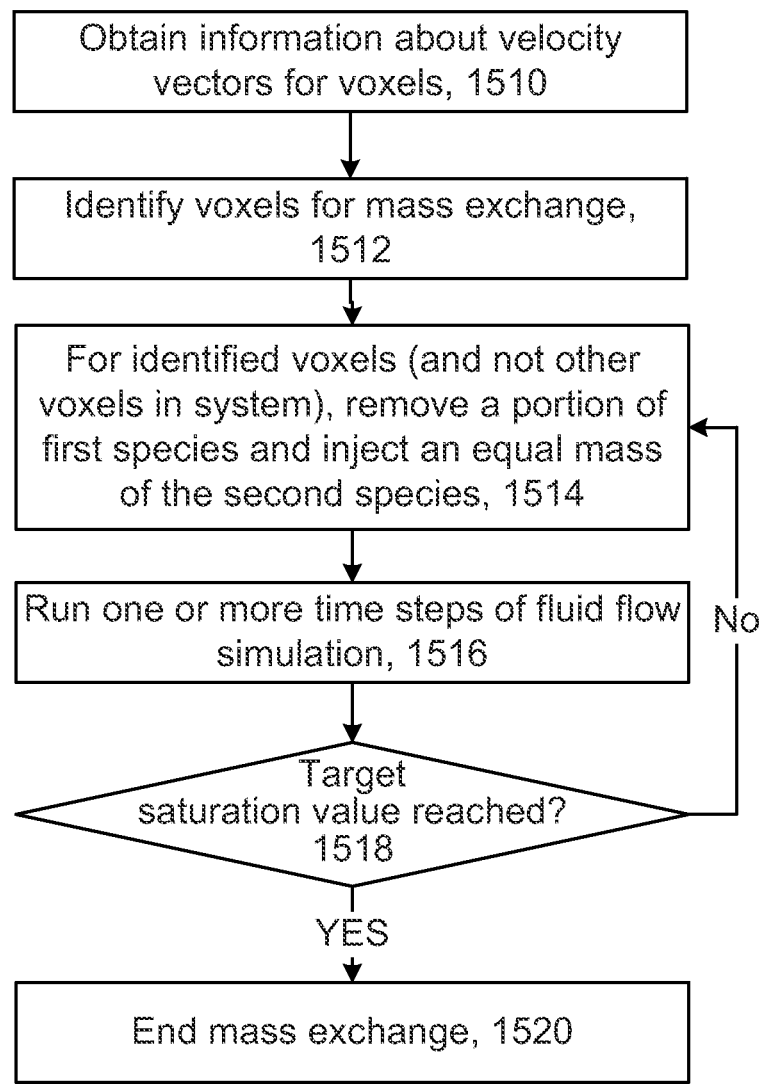
FIG. 18 is a flow chart of a procedure for mass exchange.

FIG. 18 shows an exemplary process for determining locations for the mass exchange and performing the mass exchange to reach the target saturation level. To reproduce the effects of the above described physical process in simulation, the regions of exchange (where the mass sink/source is applied) are selected to be those where there is a relatively high flow rate of the species to be replaced (e.g., regions of high oil flow in the above example). More particularly, the system obtains information about velocity vectors for voxels (1510) and identifies voxels for mass exchange (1512) based on the velocity vector information. In one example, a threshold velocity value can be stored by the system and any voxel having a velocity in excess of the threshold can be selected for mass exchange. In another example, the set of velocity vectors can be ranked and a predetermined percentage of voxels (e.g., about 10%) can be selected having the highest velocity values. In another example the exchange rate can be defined as a function of the local velocity, e.g. a fast moving oil blob will be exchanged faster compared to a slow moving oil blob. Thus, the system identifies the convective zones based on the velocity vectors and performs mass exchange in the identified convective zones. Mass exchange is not performed in the non-convective zones of the system. Fluid that is non-mobile (e.g., trapped within a pore or inaccessible) is not replaced because the velocity in such regions will be low or near zero.

Once an exchange region is identified, the species designated to be reduced are removed from that region and replaced by one (or more) of the species designated to be increased (1514). In the exchange region, the mass exchange is performed by providing both a source that inputs the species that is desired to be increased in the system and a sink that removes the species that is desired to be reduced. In the case of equal mass exchange, the source inputs a mass of the first species equal to the mass of the second species that is removed from the voxel by the sink. As described earlier the fluid density is calculate as the sum over all density distributions $$f_i \rho = \sum_i f_i.$$

All post-propagation density distributions are scaled in the following way:

$$f_{i,oil}^{MSS} = f_{i,oil} \cdot \frac{\rho + S_{oil}}{\rho}.$$

Please note that $S_{oil}$ is negative which means that the density of oil is reduced in an imbibition process. Assuming that the mean water density is identical to the mean oil density the set of density distributions of the water component is the modified similarly:

$$f_{i,water}^{MSS} = f_{i,water} \cdot \frac{\rho - S_{oil}}{\rho}.$$

For example, in an oil and water system, water replaces oil. The exchange occurs over multiple time steps with only a small portion (e.g., 0.1-0.3% 0.01%-0.03%) of the mass of a voxel being changed during a single time step. In other examples, larger exchange rates are also possible. Thus, modifying a system's saturation by 10% could take over 1000 time steps in the simulation. After replacing the portion of the mass, the system runs one or more time steps of fluid flow simulation (1516) and determines whether the target saturation value has been reached (1518). If so, the system ends the mass exchange (1520). If not, the system returns to exchanging the species at step 1514. In another example, the system monitors the saturation throughout the entire exchange process and will detect when the target saturation value has been reached.

While in the example described above, the system replaced the same amount of mass in each of the identified voxels, in some examples, the exchange amount can be based on the velocity vectors on a per voxel basis. For example, the mass can be exchanged at a greater rate in the zones with greater velocity vectors. In some examples, the mass exchange rate is directly proportional to the velocity vector for the voxel.

While in the examples described above, a velocity vector was used to determine the convective zones eligible for mass exchange, and some additional examples other values indicating movement of components within the system/voxel could be used. Instead of velocity, a location criterion could be introduced as an alternative criterion to allow the exchange process. Such location information could be obtained from another simulation or from a pore size distribution analysis (e.g. exchange only fluids within a percolation path).

Embodiments can be implemented in digital electronic circuitry, or in computer hardware, firmware, software, or in combinations thereof. Apparatus of the techniques described herein can be implemented in a computer program product tangibly embodied or stored in a machine-readable media (e.g., storage device) for execution by a programmable processor; and method actions can be performed by a programmable processor executing a program of instructions to perform operations of the techniques described herein by operating on input data and generating output. The techniques described herein can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD_ROM disks. Any of the foregoing can be supplemented by, or incorporated in, ASICs (application-specific integrated circuits).

A number of implementations have been described. Nevertheless, it will be understood that various modifications may be made without departing from the spirit and scope of the claims. Accordingly, other implementations are within the scope of the following claims.

What is claimed is:

1. A computer implemented method for determining relative permeability of a first fluid species relative to a second, different fluid species of a multi-species fluid, the method comprising:
    simulating, by a computing system that includes one or more processors and memory coupled to the one or more processors, activity of the multi-species fluid that includes the first fluid species (first species) and the second, different fluid species (second species) in a volume, with simulating the activity of the multi-species fluid modeling movement of elements of the multi-species fluid within the volume, and with the volume having a volume fraction of the first species relative to the second species;
    identifying exchange regions in the volume, based on flow rates at locations in the volume;
    removing, from the identified exchange regions, a first mass of the first species and replacing the first mass of the first species with a second mass of the second species, to modify the multi-species fluid;
    modifying the volume fraction of the volume in the identified exchange regions;
    simulating activity of the modified multi-species fluid based on the modified volume fraction in the identified exchange regions; and
    determining a relative permeability of the first species in the volume based on the modified volume fraction.

2. The method of claim 1, further comprising:
    determining a relative permeability of the second species in the volume for the volume fraction; and
    determining a relative permeability of the second species in the volume based on the modified volume fraction.

3. The method of claim 1, further comprising identifying the exchange regions in the volume, based on a value indicative of movement of the first species within the volume.

4. The method of claim 3, wherein the volume is comprised of plural voxels and identifying the exchange regions comprises identifying a set of convective voxels.

5. The method of claim 4, wherein identifying the set of convective voxels in the volume comprises identifying voxels having a high flow rate of the first species.

6. The method of claim 4, wherein identifying the set of convective voxels in the volume comprises identifying voxels in which a velocity exceeds a threshold.

7. The method of claim 4, wherein identifying the set of convective voxels in the volume comprises ranking voxels based on their associated velocity and selecting a portion of the voxels having a greatest velocity.

8. The method of claim 3, wherein removing the first mass of the first species and replacing the first mass of the first species with the second mass of the second species comprises replacing the first mass of the first species with an equal mass of the second species.

9. The method of claim 8, wherein removing, from the identified exchange regions, the first mass of the first species and replacing the first mass of the first species with the equal mass of the second species comprises performing a mass exchange process over multiple time steps until a desired volume fraction is obtained.

10. The method of claim 1, further comprises simulating the activity of the respective multi-species fluid until an effective permeability of the first species converges to an effective permeability of the second species.

11. The method of claim 1, wherein the first species comprises oil and the second species comprises water.

12. The method of claim 1, wherein the volume comprises a porous media volume.

13. The method of claim 1, wherein simulating the activity of the multi-species fluid that includes the first species and the second species in a volume or the activity of the modified multi-species fluid comprises simulating the activity of the respective multi-species fluid in a periodic domain using a gravity driven simulation.

14. The method of claim 1, wherein the volume is comprised of plural voxels and simulating activity of the multi-species fluid that includes the first species and the second species in the volume comprises:
   performing interaction operations on state vectors, the interaction operations modeling interactions between elements of different momentum states according to a model; and
   performing first move operations on the state vectors to reflect movement of elements to new voxels in the volume according to the model.

15. A computer implemented method for predicting relative permeability of a multi-species fluid, the method comprising:
   simulating by a computing system that includes one or more processors and memory coupled to the one or more processors, activity of the multi-species fluid that includes at least oil and water in a hydrocarbon reservoir, with simulating the activity of the fluid in the hydrocarbon reservoir modeling movement of elements within the hydrocarbon reservoir;
   identifying exchange regions based on velocity vectors associated with locations in the hydrocarbon reservoir;
   removing, from the identified exchange regions, a first mass of the oil and replacing the first mass of the oil with a second mass of water to modifying the volume fraction of the volume that includes the oil for which the first mass is removed and the water;
   simulating activity of the modified multi-species fluid that includes the oil for which the first mass is removed and the water based on the modified volume fraction in the identified exchange regions; and
   determining a relative permeability of oil and a relative permeability of water in the hydrocarbon reservoir based on the modified volume fraction.

16. A computer program product tangibly embodied in a non-transitory computer readable medium, the computer program product including instructions that, when executed, simulate a physical process fluid flow, the computer program product configured to cause a computer to:
   simulate activity of a multi-species fluid that includes a first species and a second species in a volume, with simulating the activity of the multi-species fluid in the volume modeling movement of elements of the multi-species fluid within the volume, and with the volume having a volume fraction of the first species relative to the second species;
   identify exchange regions in the volume based on flow rates at locations in the volume;
   remove, from the identified exchange regions, a first mass of the first species and replace the first mass of the first species with a second mass of the second species to modify the volume fraction of the volume in the identified exchange regions;
   simulate activity of the modified multi-species fluid based on the modified volume fraction in the identified exchange regions; and
   determine a relative permeability of the first species in the volume based on the modified volume fraction.

17. The computer program product of claim 16, further configured to identify the exchange regions in the volume, based on a value indicative of movement of the first species within the volume.

18. The computer program product of claim 17, wherein the volume is comprised of plural voxels and the configurations to identify the exchange regions comprise configurations to identify a set of convective voxels.

19. The computer program product of claim 18, wherein the configurations to identify the set of convective voxels in the volume comprise configurations to identify voxels having a high flow rate of the first species.

20. The computer program product of claim 18, wherein the configurations to identify the set of convective voxels in the volume comprise configurations to identify voxels in which a velocity exceeds a threshold.

21. The computer program product of claim 18, wherein the configurations to identify the set of convective voxels in the volume comprise configurations to rank voxels based on their associated velocity and select a portion of the voxels having a greatest velocity.

22. The computer program product of claim 17, wherein the configurations to remove the first mass of the first species and replace the first mass of the first species with the second mass of the second species comprise configurations to replace the first mass of the first species with an equal mass of the second species.

23. The computer program product of claim 17, wherein the first species comprises oil and the second species comprises water and the volume comprises a porous media volume.

24. The computer program product of claim 16, wherein the configurations to simulate the activity of the multi-species fluid that includes the first species and the second species in a volume or the activity of the modified multi-species fluid comprise configurations to simulate the activity of the respective multi-species fluid in a periodic domain using a gravity driven simulation.

25. A computer system for simulating a physical process fluid flow, the system being configured to:
   simulate activity of a multi-species fluid that includes a first species and a second species in a volume, with the activity of the multi-species fluid simulated to model movement of elements of the multi-species fluid within the volume, and with the volume having a volume fraction of the first species relative to the second species;
   identify exchange regions in the volume based on flow rates at locations in the volume;
   remove, from the identified exchange regions, a first mass of the first species and replace the first mass of the first species with a second mass of the second species to modify the volume fraction of the volume in the identified exchange regions;
   simulate activity of the modified multi-species fluid based on the modified volume fraction in the identified exchange regions; and
   determine a relative permeability of the first species in the volume based on the modified volume fraction.

26. The system of claim 25, further configured to identify the exchange regions in the volume, based on a value indicative of movement of the first species within the volume.

27. The system of claim 26, wherein the volume is comprised of plural voxels and the configurations to identify the exchange regions comprise configurations to identify a set of convective voxels.

28. The system of claim 27, wherein the configurations to identify the set of convective voxels in the volume comprise configurations to identify voxels having a high flow rate of the first species.

29. The system of claim 27, wherein the configurations to identify the set of convective voxels in the volume comprise configurations to identify voxels in which a velocity exceeds a threshold.

30. The system of claim 27, wherein the configurations to identify the set of convective voxels in the volume comprise configurations to rank voxels based on their associated velocity and select a portion of the voxels having a greatest velocity.

31. The system of claim 26, wherein the configurations to remove the first mass of the first species and replace the first mass of the first species with the second mass of the second species comprise configurations to replace the first mass of the first species with an equal mass of the second species.

32. The system of claim 25, wherein the first species comprises oil and the second species comprises water and the volume comprises a porous media volume.

33. The system of claim 25, wherein the configurations to simulate the activity of the multi-species fluid that includes the first species and the second species in a volume or the activity of the modified multi-species fluid comprise configurations to simulate the activity of the respective multi-species fluid in a periodic domain using a gravity driven simulation.

* * * * *

UNITED STATES PATENT AND TRADEMARK OFFICE
CERTIFICATE OF CORRECTION

PATENT NO. : 10,550,690 B2  
APPLICATION NO. : 14/277909  
DATED : February 4, 2020  
INVENTOR(S) : Bernd Crouse et al.

It is certified that error appears in the above-identified patent and that said Letters Patent is hereby corrected as shown below:

On the Title Page

Column 1, (72) Inventors section, Line 11, delete "M. Feed," insert --M. Freed,--;

In the Claims

Column 29, Line 37, Claim 16, delete "non- transitory" insert --non-transitory--.

Signed and Sealed this  
Twenty-fourth Day of November, 2020

Andrei Iancu  
*Director of the United States Patent and Trademark Office*